US010540928B2

(12) United States Patent
Kim et al.

(10) Patent No.: US 10,540,928 B2
(45) Date of Patent: Jan. 21, 2020

(54) ELECTROLUMINESCENT DISPLAY DEVICE

(71) Applicant: LG Display Co., Ltd., Seoul (KR)

(72) Inventors: Donghyun Kim, Bucheon-si (KR);
JuhnSuk Yoo, Bucheon-si (KR);
JungChul Kim, Bucheon-si (KR);
Haeyoon Jeong, Bucheon-si (KR);
Hoonju Chung, Bucheon-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/563,803

(22) Filed: Sep. 6, 2019

(65) Prior Publication Data

US 2019/0392764 A1    Dec. 26, 2019

Related U.S. Application Data

(62) Division of application No. 16/038,460, filed on Jul. 18, 2018, now Pat. No. 10,438,538.

(30) Foreign Application Priority Data

Nov. 30, 2017 (KR) .......................... 10-2017-0163681
Nov. 30, 2017 (KR) .......................... 10-2017-0163688

(51) Int. Cl.
*G09G 3/3258* (2016.01)
*H01L 27/32* (2006.01)

(52) U.S. Cl.
CPC ....... *G09G 3/3258* (2013.01); *H01L 27/3248* (2013.01); *H01L 27/3276* (2013.01); *G09G 2310/0243* (2013.01); *G09G 2310/0264* (2013.01)

(58) Field of Classification Search
CPC ......... G09G 3/3258; G09G 2310/0243; G09G 2310/0264; H01L 27/3248; H01L 27/3276
See application file for complete search history.

(56) References Cited

U.S. PATENT DOCUMENTS

| | | |
|---|---|---|
| 2009/0273590 A1 | 11/2009 | Tanikame et al. |
| 2011/0157126 A1 | 6/2011 | Chung et al. |
| 2013/0057532 A1 | 3/2013 | Lee et al. |
| 2014/0184481 A1 | 7/2014 | Kim et al. |
| 2016/0275869 A1 | 9/2016 | Hwang et al. |
| 2016/0351121 A1 | 12/2016 | Kim et al. |
| 2016/0351124 A1 | 12/2016 | Kim et al. |
| 2017/0092199 A1* | 3/2017 | Park ................. G09G 3/3258 |
| 2018/0025683 A1* | 1/2018 | Oh .................... G09G 3/2018 345/690 |
| 2018/0114488 A1 | 4/2018 | Jung |
| 2018/0130409 A1 | 5/2018 | Kiang et al. |
| 2018/0182289 A1 | 6/2018 | Jung et al. |
| 2019/0066598 A1 | 2/2019 | Kim et al. |

FOREIGN PATENT DOCUMENTS

| | | |
|---|---|---|
| CN | 103021333 B | 1/2016 |
| CN | 107274829 A | 10/2017 |
| EP | 3098804 A2 | 11/2016 |

* cited by examiner

*Primary Examiner* — Dmitriy Bolotin
(74) *Attorney, Agent, or Firm* — Morgan, Lewis & Bockius LLP

(57) ABSTRACT

Disclosed is an electroluminescent display device. The electroluminescent display device includes a display area and a non-display area. And the electroluminescent display device includes a display panel including a plurality of pixel lines each including a plurality of pixel circuits.

18 Claims, 41 Drawing Sheets

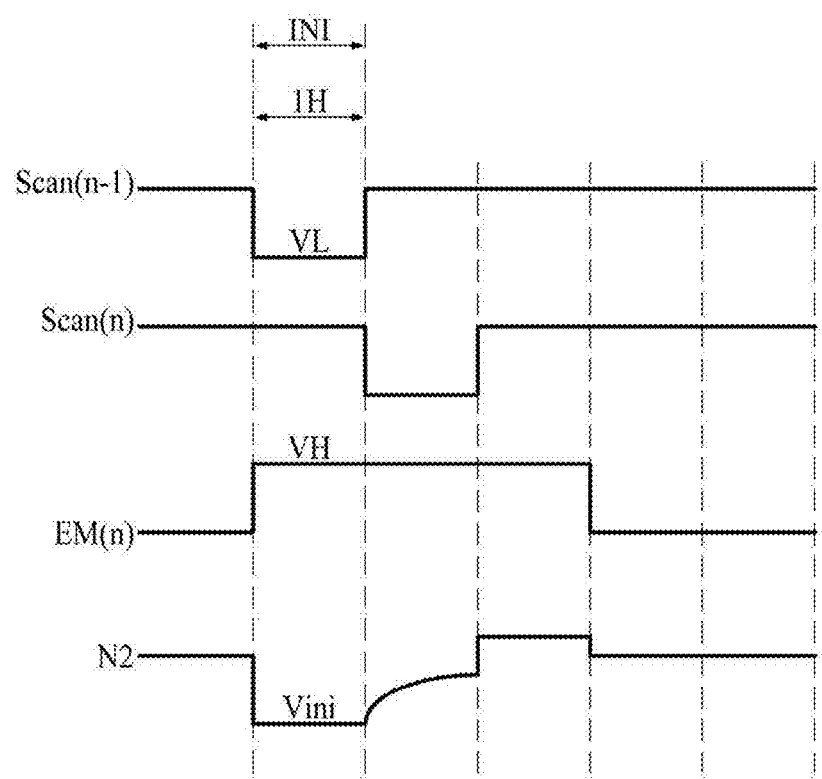

ELECTROLUMINESCENT DISPLAY DEVICE

CROSS-REFERENCE TO RELATED APPLICATIONS

This application is a Divisional of U.S. patent application Ser. No. 16/038,460, filed Jul. 18, 2018, claims the benefit of the Korean Patent Applications No. 10-2017-0163682 filed on Nov. 30, 2017 and No. 10-2017-0163688 filed on Nov. 30, 2017, in the Korean Intellectual Property Office, the disclosures of which are incorporated herein by reference in its entirety.

BACKGROUND

Technical Field

The present disclosure relates to an electroluminescent display device, and more particularly, to an electroluminescent display device including a pixel circuit for compensating a voltage drop.

Discussion of the Related Art

With the advancement of information-oriented technology, the market in display devices corresponding to a connection medium between a user and information is increasing. The use of various types of display devices such as electroluminescent display devices, liquid crystal display devices, and quantum dot display devices is increasing.

In the electroluminescent display devices, when a gate signal, a data signal, and the like are supplied to at least one of subpixels, a light emitting device of a selected subpixel emits light, thereby displaying an image. Light emitting devices may be implemented based on an organic material or an inorganic material.

The electroluminescent display devices display an image, based on light emitted from a light emitting device of each subpixel, and thus, it is required to enhance an accuracy of a pixel circuit which controls light emission of each subpixel, for enhancing the quality of an image displayed by the electroluminescent display devices. For example, an accuracy of the pixel circuit is enhanced by compensating for a sequential shift characteristic (or time-varying characteristic) where a threshold voltage of a transistor included in the pixel circuit is shifted.

There are various methods of compensating for a sequential shift characteristic of the electroluminescent display devices. Some of compensation methods do not consider the drop of a source voltage applied to each subpixel, causing an image quality issue such as the vertical luminance non-uniformity or crosstalk of the electroluminescent display devices.

Therefore, research for designing a pixel circuit compensated for the drop of the source voltage is being done in order for the electroluminescent display devices to display an accurate image.

SUMMARY

Accordingly, embodiments of the present disclosure are directed to an electroluminescent display device that substantially obviates one or more of the problems due to limitations and disadvantages of the related art.

An aspect of the present disclosure is to provide a display device for minimizing voltage drop occurring in a line to which a voltage is applied.

Another aspect of the present disclosure is to provide a pixel circuit and an electroluminescent display device including the same, in which an image quality issue such as the vertical luminance non-uniformity or crosstalk of a display panel is solved through compensation based on voltage drop occurring in a line to which a voltage is applied.

Another aspect of the present disclosure is to provide an electroluminescent display device in which the area for the subpixels can be reduced, e.g. by depositing some of transistors included in each subpixel in a non-display area, and thus, a high-resolution display device is realized.

Another aspect of the present disclosure is directed to an electroluminescent display device in which an operation of supplying a reference voltage is set based on a driving method of a subpixel in order for voltage drop not to affect a driving current applied to a light emitting device.

In addition to the aforesaid objects of the present disclosure, other features and advantages of the present disclosure will be described below, but will be clearly understood by those skilled in the art from descriptions below.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described, an electroluminescent display device comprises a display panel including a plurality of pixel lines each including a plurality of pixel circuits. Also, each of the plurality of pixel circuits included in an nth (where n is a natural number) pixel line of the plurality of pixel lines may include a driving transistor connected between a first node and a third node and including a gate connected to a second node, a first transistor allowing a current to flow between the second node and the third node in response to an n–1st scan signal, a second transistor applying a reference voltage to the first node in response to an nth scan signal, a third transistor applying a high-level power voltage to the first node in response to an nth emission signal, a fourth transistor allowing a current to flow between the third node and a fourth node in response to an n+1st emission signal, a fifth transistor applying an initialization voltage to the fourth node in response to the n–1st scan signal, a sixth transistor applying the high-level power voltage to a fifth node in response to the nth emission signal, a seventh transistor applying a data voltage to the fifth node in response to the n–1st scan signal, a capacitor connected between the second node and the fifth node, and a light emitting device including an anode connected to the fourth node and a cathode connected to a line to which a low-level power voltage is applied. Accordingly, a subpixel supplied with the reference voltage may provide the light emitting device with a driving current unaffected by the high-level power voltage, thereby solving an image quality issue of the electroluminescent display device.

The display panel may include a display area and a non-display area. The second and/or the third transistors may be disposed in the non-display area.

In another aspect, an electroluminescent display device comprises a display panel including a display area and a non-display area and including a plurality of pixel lines each including a plurality of pixel circuits. Also, each of the plurality of pixel circuits included in an nth pixel line of the plurality of pixel lines may include a driving transistor connected between a first node and a third node and including a gate connected to a second node, a first transistor allowing a current to flow between the second node and the third node in response to an nth scan signal, a second transistor applying a reference voltage to the first node in response to the nth scan signal, a third transistor applying a high-level power voltage to the first node in response to an nth emission signal, a fourth transistor allowing a current to flow between the third node and a fourth node in response to the nth emission signal, a fifth transistor applying an initialization voltage to the fourth node in response to the nth scan signal, a sixth transistor applying the high-level power voltage to a fifth node in response to the nth emission signal, a seventh transistor applying a data voltage to the fifth node in response to the nth scan signal, an eighth transistor supplying an initialization voltage to the second node in response to an n−1st scan signal, a capacitor connected between the second node and the fifth node, and a light emitting device including an node connected to the fourth node and a cathode connected to a line to which a low-level power voltage is applied. Accordingly, a subpixel supplied with the reference voltage may provide the light emitting device with a driving current unaffected by the high-level power voltage, thereby solving an image quality issue of the electroluminescent display device.

The display panel may include a display area and a non-display area. The second and/or the third transistors may be disposed in the non-display area.

In another aspect, an electroluminescent display device comprises a display panel including a display area and a non-display area and including a plurality of pixel lines each including a plurality of pixel circuits. Also, each of the plurality of pixel circuits included in an nth pixel line of the plurality of pixel lines may include a driving transistor connected between a first node and a third node and including a gate connected to a second node, a first transistor allowing a current to flow between the second node and the third node in response to an n+1st scan signal, a second transistor applying a reference voltage to the first node in response to an nth scan signal, a third transistor applying a high-level power voltage to the first node in response to an nth emission signal, a fifth transistor applying an initialization voltage to the fourth node in response to an n−1st scan signal, a sixth transistor applying the high-level power voltage to a fifth node in response to the nth emission signal, a ninth transistor applying the high-level power voltage to the fifth node in response to the n−1st scan signal, a seventh transistor applying a data voltage to the fifth node in response to the n+1st scan signal, a capacitor connected between the second node and the fifth node, and a light emitting device including an anode connected to the fourth node and a cathode connected to a line to which a low-level power voltage is applied. Accordingly, a subpixel supplied with the reference voltage may provide the light emitting device with a driving current unaffected by the high-level power voltage, thereby solving an image quality issue of the electroluminescent display device.

The display panel may include a display area and a non-display area. The second and/or the third transistors may be disposed in the non-display area.

In another aspect, an electroluminescent display device comprises a display panel including a display area and a non-display area and including a plurality of pixel lines each including a plurality of pixel circuits. Also, each of the plurality of pixel circuits included in an nth pixel line of the plurality of pixel lines may include a driving transistor connected between a first node and a third node and including a gate connected to a second node, a first transistor allowing a current to flow between the second node and the third node in response to an nth scan signal, a second transistor applying a reference voltage to the first node in response to the nth scan signal, a third transistor applying a high-level power voltage to the first node in response to an nth emission signal, a fifth transistor applying an initialization voltage to a fourth node in response to the nth scan signal, a sixth transistor applying the high-level power voltage to a fifth node in response to the nth emission signal, a ninth transistor applying the high-level power voltage to a fifth node in response to an n−1st scan signal, a seventh transistor applying a data voltage to the fifth node in response to the nth scan signal, an eighth transistor supplying an initialization voltage to the second node in response to the n−1st scan signal, a fourth transistor allowing a current to flow between the third node and a fourth node in response to the nth emission signal, a capacitor connected between the second node and the fifth node, and a light emitting device including an node connected to the fourth node and a cathode connected to a line to which a low-level power voltage is applied. Accordingly, a subpixel supplied with the reference voltage may provide the light emitting device with a driving current unaffected by the high-level power voltage, thereby solving an image quality issue of the electroluminescent display device.

The display panel may include a display area and a non-display area. The second and/or the third transistors may be disposed in the non-display area.

Details of other embodiments are included in the detailed description and the drawings.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated and constitute a part of this application, illustrate embodiments of the disclosure and together with the description serve to explain various principles. In the drawings:

FIG. 10B is a waveform diagram for describing driving of the subpixel illustrated in FIG. 10A;

DETAILED DESCRIPTION OF THE DISCLOSURE

Figure 1:
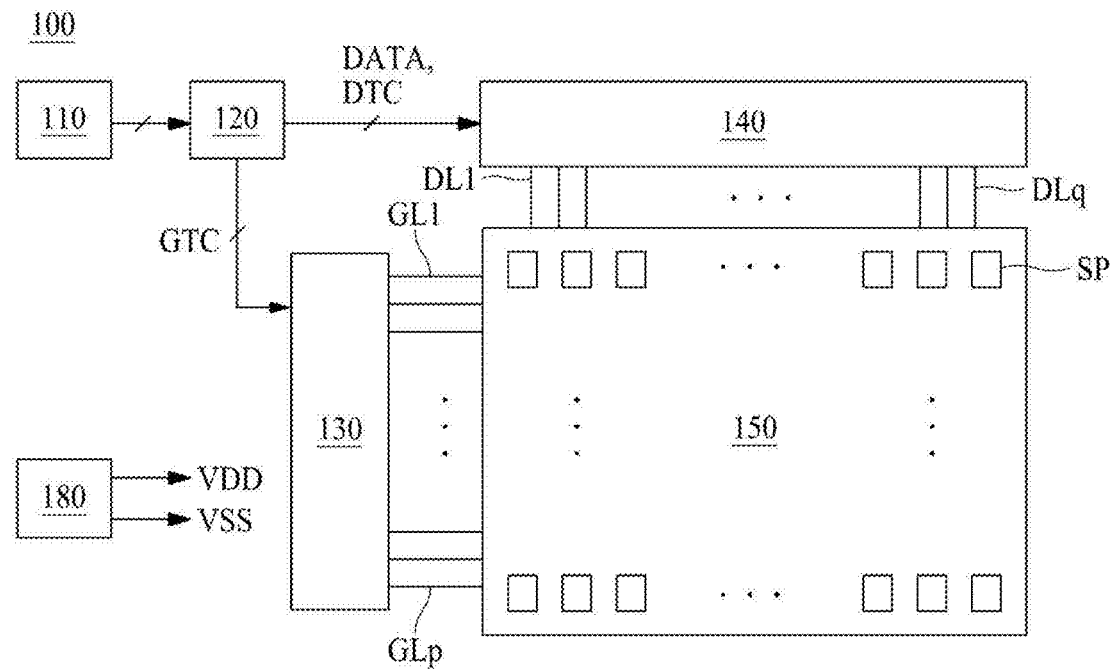
FIG. 1 is a block diagram illustrating an electroluminescent display device according to an embodiment of the present disclosure.

Reference will now be made in detail to the embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art. Furthermore, the present disclosure is only defined by scopes of claims.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted. In a case where 'comprise', 'have', and 'include' described in the present specification are used, another part may be added unless 'only-' is used. The terms of a singular form may include plural forms unless referred to the contrary.

In construing an element, the element is construed as including an error range although there is no explicit description.

In describing a position relationship, for example, when a position relation between two parts is described as 'on-', 'over-', 'under-', and 'next-', one or more other parts may be disposed between the two parts unless 'just' or 'direct' is used.

In describing a time relationship, for example, when the temporal order is described as 'after-', 'subsequent-', 'next-', and 'before-', a case which is not continuous may be included unless 'just' or 'direct' is used.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

In the present specification, a pixel circuit provided on a substrate of a display panel may be implemented with an n-type or p-type transistor. For example, the transistor may be implemented as a transistor having a metal oxide semiconductor field effect transistor (MOSFET) structure. The transistor may be a three-electrode element including a gate electrode (gate), a source electrode (source), and a drain electrode (drain). The source may be an electrode for supplying a carrier to the transistor. In the transistor, the carrier may start to flow from the source. The drain may be an electrode through which the carrier flows out from the transistor to the outside. For example, in the transistor, the carrier may flow from the source to the drain. In the n-type transistor, since the carrier is an electron, a source voltage may have a level which is lower than that of a drain voltage. In the n-type transistor, since the electron flows from the source to the drain, a current may flow from the drain to the source. In the p-type transistor, since the carrier is a hole, a source voltage may be higher than a drain voltage in order for the hole to flow from the source to the drain. In the p-type transistor, since the hole flows from the source to the drain, a current may flow from the source to the drain. The source and the drain of the transistor may not be fixed, and based on an applied voltage, the source and the drain of the transistor may switch therebetween. Also, the source and the drain of the transistor may be respectively referred to as a first electrode and a second electrode, or may be respectively referred to as a second electrode and a first electrode.

Hereinafter, a gate-on voltage may be a voltage of a gate signal for turning on a transistor. A gate-off voltage may be a voltage of the gate signal for turning off the transistor. In the p-type transistor, the gate-on voltage may be a gate low voltage or a logic low voltage (VL) and the gate-off voltage may be a gate high voltage or a logic high voltage (VH). In the n-type transistor, the gate-on voltage may be a gate high voltage or a logic high voltage (VH), and the gate-off voltage may be a gate low voltage or a logic low voltage (VL). Also, levels of a high-level power voltage, a low-level power voltage, an initialization voltage, a reference voltage, a data voltage, a gate high voltage, and a gate low voltage described below may vary based on a luminance of an electroluminescent display device.

Hereinafter, an electroluminescent display device according to embodiments of the present disclosure will be described with reference to the accompanying drawings.

FIG. 1 is a block diagram illustrating an electroluminescent display device 100 according to an embodiment of the present disclosure.

Referring to FIG. 1, the electroluminescent display device 100 may include an image processor 110, a timing controller 120, a gate driver 130, a data driver 140, and a display panel 150.

The image processor 110 may output image data supplied from the outside and a driving signal for driving various elements. The driving signal output from the image processor 110 may include a data enable signal, a vertical sync signal, a horizontal sync signal, and a clock signal.

The timing controller 120 may be supplied with the image data and the driving signal from the image processor 110. The timing controller 120 may output a gate timing control signal GTC for controlling an operation timing of the gate driver 130 and a data timing control signal DTC for controlling an operation timing of the data driver 140, based on the driving signal.

The gate driver 130 may output a scan signal in response to the gate timing control signal GTC supplied from the timing controller 120. The gate driver 130 may output a gate signal through a plurality of gate lines GL1 to GLp (where p is an integer equal to or more than two). The gate driver 130 may be implemented as an integrated circuit (IC) type, or may be implemented as a gate in panel (GIP) type which is embedded into the display panel 150. The gate driver 130 may be disposed on each or one of the left and the right of the display panel 150. The gate driver 130 may respectively output first to pth scan signals to first to pth scan lines of the display panel 150.

The data driver 140 may output a data voltage in response to the data timing control signal DTC supplied from the timing controller 120. The data driver 140 may sample and latch a digital data signal DATA supplied from the timing controller 120 to convert the digital data signal DATA into an analog data signal based on a gamma reference voltage. The data driver 140 may output the data signal through a plurality of data lines DL1 to DLq (where q is an integer equal to or more than two). The data driver 140 may be provided as an IC type on the display panel 150, or may be provided as a chip on film (COF) type on the display panel 150.

A power supply 180 may output a high-level power voltage VDD, a low-level power voltage VSS, etc. The high-level power voltage VDD and the low-level power voltage VSS output from the power supply 180 may be supplied to the display panel 150. The high-level power voltage VDD may be supplied to the display panel 150 through a high level power line, and the low-level power voltage VSS may be supplied to the display panel 150 through a low level power line. A voltage output from the power supply 180 may be used by the gate driver 130 or the data driver 140.

The display panel 150 may display an image, based on the gate signal and the data signal respectively supplied from the gate driver 130 and the data driver 140 and a source voltage supplied from the power supply 180.

The display panel 150 may include a display area, where a plurality of subpixels SP are provided, and a non-display area which is disposed outside the display area and includes various signal lines, a plurality of pads, and/or the like. The display area may be an area which displays an image, and thus, may be an area where the subpixels SP are disposed. The non-display area may be an area which does not display an image, and thus, may be an area where a plurality of dummy subpixels is disposed or the subpixels SP are not disposed. Each subpixel SP may be electrically operated by a pixel circuit. The pixel circuit may comprise a first part being arranged in the display area of the display panel 150 and thus may be a part DA of the subpixel SP. The pixel circuit may also comprise a second part being arranged in the non-display area DA of the display panel 150 and thus may not be a part of the subpixel SP. The combination of the first part and the second part may form the pixel circuit.

The display area may include the plurality of subpixels SP and may display an image, based on a gray level displayed by each of the subpixels SP. Each of the subpixels SP may be connected to a data line arranged along a column line and may be connected to a gate line arranged along a pixel line or a row line. Subpixels SP connected to the same pixel line may share the same gate line and may be simultaneously supplied with the gate signal through a corresponding gate line. Also, if subpixels SP disposed on a first pixel line are defined as first subpixels and subpixels SP disposed on a pth pixel line are defined as pth subpixels, first to pth subpixels may be sequentially driven.

The subpixels SP of the display panel 150 may be arranged as a matrix type to configure a pixel array, but are not limited thereto. The subpixels SP of the display panel 150 may be arranged as various types such as a pixel sharing type, a stripe type, and a diamond type, in addition to the matrix type.

The subpixels SP may include a red subpixel, a green subpixel, and a blue subpixel, or may include a white subpixel, a red subpixel, a green subpixel, and a blue subpixel. The subpixels SP may have one or more different emission areas, based on an emission characteristic.

Figure 2:
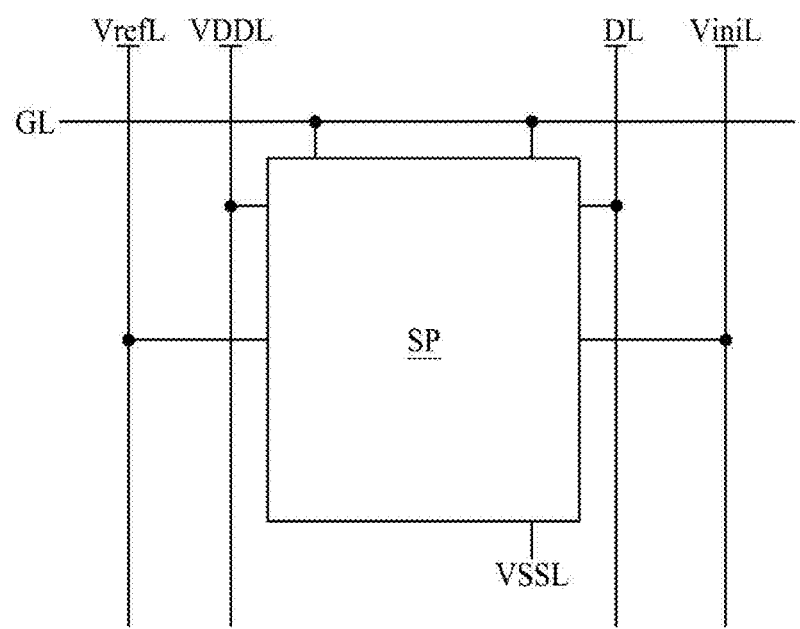
FIG. 2 is a block diagram illustrating a subpixel illustrated in FIG. 1 and signal lines connected to the subpixel.

FIG. 2 is a block diagram illustrating a subpixel illustrated in FIG. 1 and signal lines connected to the subpixel SP.

One subpixel SP may be connected to a gate line GL, a data line DL, a high level power line VDDL, a low level power line VSSL, an initialization voltage line ViniL, and a reference voltage line VrefL. The number of transistors and capacitors included in the subpixel SP and a driving method of the subpixel SP may be determined based on a configuration of a pixel circuit, e.g. by the configuration of the first part of the pixel circuit disposed (arranged) on the display area. In this case, the gate line may include a plurality of scan lines, through which a scan signal is transferred, and a plurality of emission lines through which an emission signal is transferred.

Figure 3:
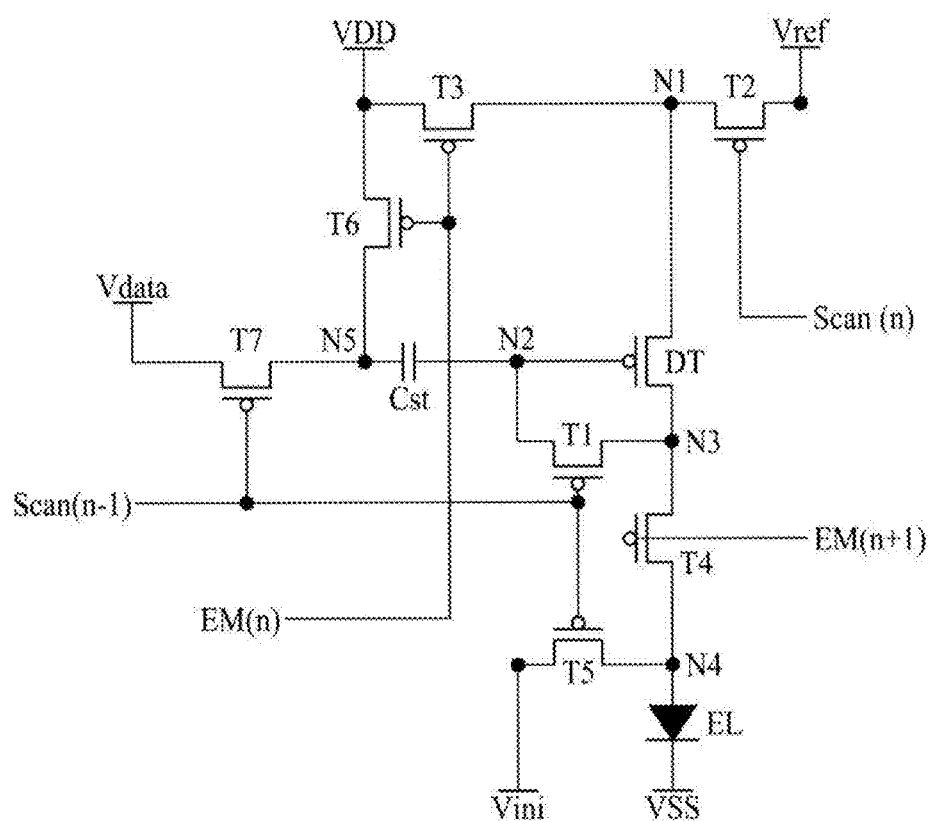
FIG. 3 is a circuit diagram of a subpixel according to a first embodiment of the present disclosure.

FIG. 3 is a circuit diagram of a subpixel SP according to a first embodiment of the present disclosure.

The display panel 150 may include the display area, which displays an image based on the subpixels SP and/or the first part of the pixel circuits, and the non-display DA area which does not display an image and where signal lines, driving circuits, the second part of the pixel circuits, and the like are disposed.

The electroluminescent display device 100 may display an image based on light emitted from a light emitting device EL included in each of the subpixels SP. However, in each subpixel SP, the voltage drop of a line to which a source voltage is applied occurs due to a sequential shift characteristic where a threshold voltage of an element included in each subpixel SP is shifted and enlarging of the display panel 150, and thus, it is required to compensate for the voltage drop.

Therefore, a pixel circuit which recognizes a problem causing an image quality issue such as vertical luminance non-uniformity or crosstalk in an electroluminescent display device according to an embodiment of the present disclosure and solves the problem will be described below. Additionally, the first part of the pixel circuit that is arranged in the display area DA, needs to be miniaturized to enable higher resolutions of the display panel 150. An example where a below-described pixel circuit is configured with p-type transistors will be described, but the present embodiment is not limited thereto. In other embodiments, n-type transistors may be applied. Also, an example where a subpixel SP according to a first embodiment of the present disclosure is a subpixel SP disposed on an nth (where n is a natural number satisfying 1≤n≤p) pixel line will be described.

An nth subpixel SP may include first to seventh transistors T1 to T7, a driving transistor DT, a capacitor Cst, and a light emitting device EL. In the first embodiment of the present disclosure, the nth subpixel SP may be implemented based on a total of eight transistors and one capacitor.

The driving transistor DT may include a source connected to a first node N1, a gate connected to a second node N2, and a drain connected to a third node N3. When a gate-on voltage is applied to the second node N2, the driving transistor DT may be turned on to provide a constant current to the third node N3.

The first transistor T1 may include a gate connected to an n−1st scan line, a source connected to the second node N2, and a drain connected to the third node N3. The first transistor T1 may be turned on in response to a gate-on voltage of an n−1st scan signal Scan(n−1) applied through the n−1st scan line. When the first transistor T1 is turned on, the gate and the drain of the driving transistor DT may be electrically connected to each other, and thus, the driving transistor DT may be in a diode connection state.

The second transistor T2 may include a gate connected to an nth scan line, a source connected to a reference voltage line, and a drain connected to the first node N1. The second transistor T2 may be turned on in response to a gate-on voltage of an nth scan signal Scan(n) applied through the nth scan line. When the second transistor T2 is turned on, a reference voltage Vref may be applied to the first node N1.

The third transistor T3 may include a gate connected to an nth emission line, a source connected to a high level power line, and a drain connected to the first node N1. The third transistor T3 may be turned on in response to a gate-on voltage of an nth emission signal EM(n) applied through the nth emission line. When the third transistor T3 is turned on, a high-level power voltage VDD may be applied to the first node N1.

The fourth transistor T4 may include a gate connected to an n+1st emission line, a source connected to the third node N3, and a drain connected to a fourth node N4. In this case, the fourth node N4 may be connected to an anode of the light emitting device EL. The fourth transistor T4 may be turned on in response to a gate-on voltage of an n+1st emission signal EM(n+1) applied through the n+1st emission line. When the fourth transistor T4 is turned on, a current may flow between the third node N3 and the fourth node N4.

The light emitting device EL may include the anode connected to the fourth node N4 and a cathode to which a low-level power voltage VSS is applied. When the fourth transistor T4 is turned on, a driving current generated through the driving transistor DT may be applied to the anode of the light emitting device EL, and thus, the light emitting device EL may emit light. For example, the low-level power voltage VSS may be a voltage of −4V to −2.5V, but is not limited thereto.

The fifth transistor T5 may include a gate connected to the n−1st scan line, a source connected to the anode of the light emitting device EL, and a drain connected to an initialization line. The fifth transistor T5 may be turned on in response to the gate-on voltage of the n−1st scan signal Scan(n−1) applied through the n−1st scan line. When the fifth transistor T5 is turned on, the anode of the light emitting device EL may be initialized based on an initialization voltage.

The sixth transistor T6 may include a gate connected to the nth emission line, a source connected to the high level power line, and a drain connected to a fifth node N5. The sixth transistor T6 may be turned on in response to the gate-on voltage of the nth emission signal EM(n) applied through the nth emission line. When the sixth transistor T6 is turned on, the high-level power voltage VDD may be applied to the fifth node N5.

The capacitor Cst may include a first electrode connected to the second node N2 and a second electrode connected to the fifth node N5.

The seventh transistor T7 may include a gate connected to the n−1st scan line, a source connected to a data line, and a drain connected to the fifth node N5. The seventh transistor T7 may be turned on in response to the gate-on voltage of the n−1st scan signal Scan(n−1) applied through the n−1st scan line. When the seventh transistor T7 is turned on, a data voltage Vdata may be applied to the fifth node N5.

Moreover, a voltage applied to the gate of the driving transistor DT may control a turn-on state of the driving transistor DT, and thus, a transistor including a source or a drain connected to the gate of the driving transistor DT may include two or more transistors serially connected to each other, for maximally suppressing an influence of a leakage current. In this case, the two or more transistors may be controlled by the same control signal. Accordingly, in the nth subpixel SP according to the first embodiment of the present disclosure, the first transistor T1 may be implemented as a double-gate type transistor.

The nth subpixel SP according to the first embodiment of the present disclosure may operate in the order of an initialization period, a sampling period, a holding period, a programming period, and an emission period. The initialization period may be a period where the gate of the driving transistor DT is initialized, the sampling period may be a period where a threshold voltage of the driving transistor DT is sampled and a data voltage Vdata is applied through a data line, and the holding period may be a period where the reference voltage Vref is held by a specific node and an error of a voltage applied to the gate of the driving transistor DT in the programming period subsequent thereto is prevented from being caused by an RC delay of the n−1st scan signal Scan(n−1). Also, the programming period may be a period where the high-level power voltage VDD is applied to the gate and the source of the driving transistor DT, and the emission period may be a period where the light emitting device EL emits light with a driving current generated based on the data voltage Vdata.

The nth subpixel SP according to the first embodiment of the present disclosure may have an initialization period INI, a sampling period SAM, a holding period HLD, and a programming period PRG during a period where a gate-off voltage of the nth emission signal EM(n) or the n+1s emission signal EM(n+1) is applied, and thus, compensation based on an internal circuit may be performed. An operation characteristic during the periods will be described below. For example, a gate-on voltage of a scan signal may be applied during two horizontal periods 2H, and a gate-off voltage of an emission signal may be applied during three horizontal periods 3H. Also, for example, each of the initialization period INI, the sampling period SAM, the holding period HLD, and the programming period PRG may be executed during one horizontal period 1H. Driving of the pixel circuit will be described below with reference to the drawings.

Figure 4A:
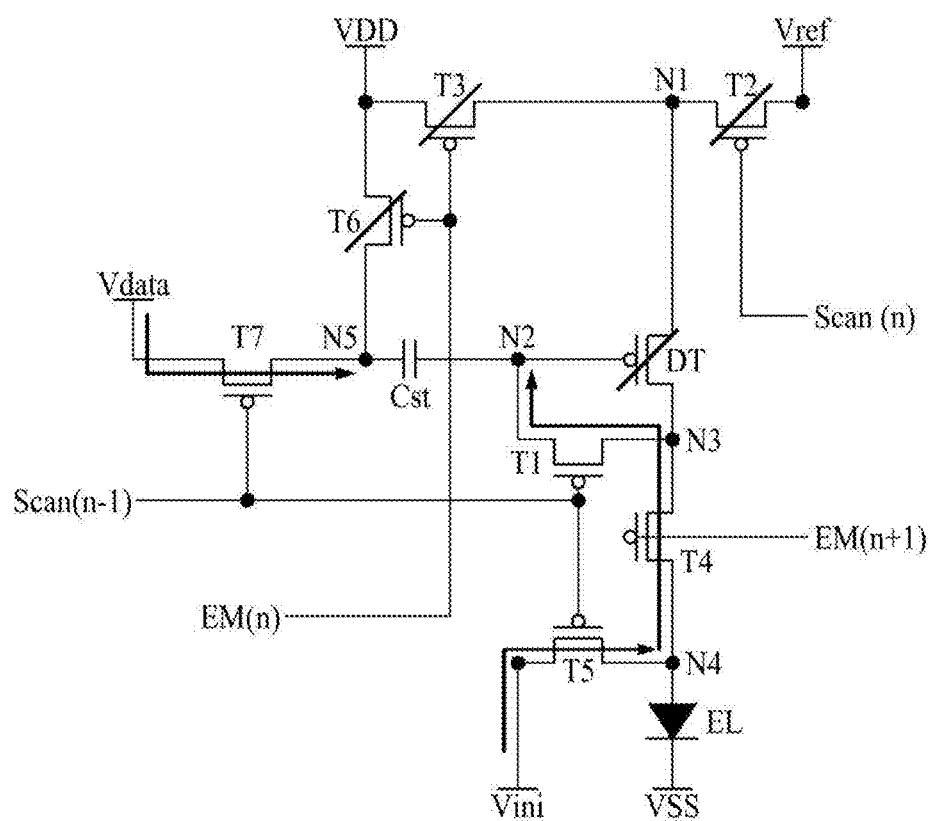
FIG. 4A is a diagram for describing driving of a subpixel according to a first embodiment of the present disclosure in an initialization period.
Figure 4B:
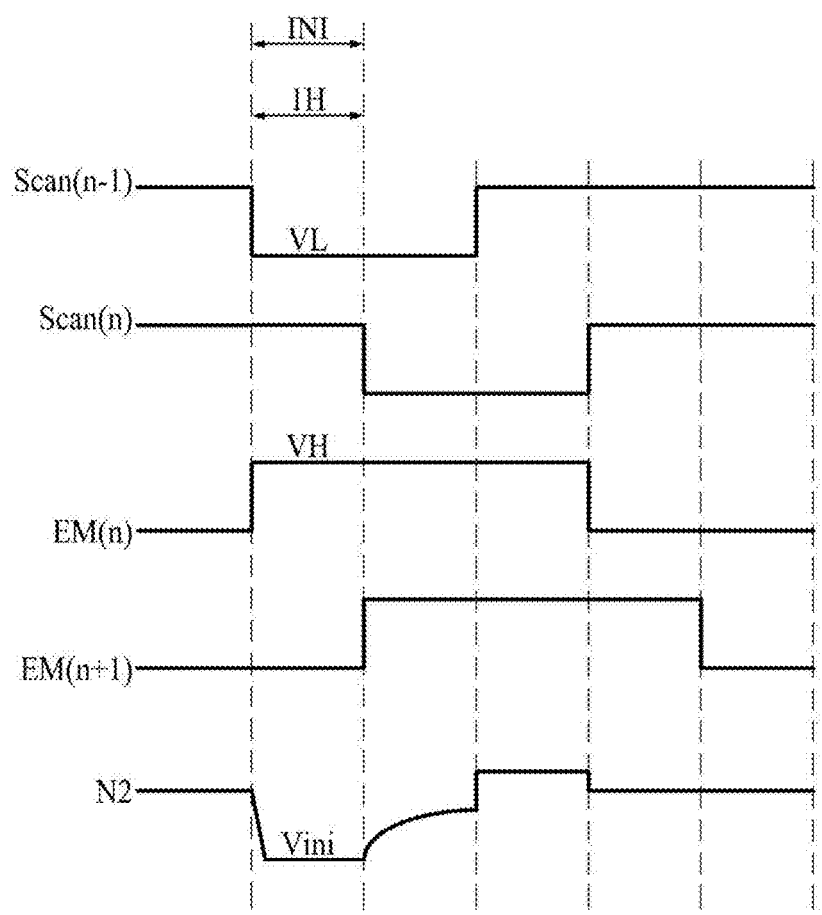
FIG. 4B is a waveform diagram for describing driving of the subpixel illustrated in FIG. 4A.

FIG. 4A is a diagram for describing driving of the subpixel according to the first embodiment of the present disclosure in the initialization period. FIG. 4B is a waveform diagram for describing driving of the subpixel illustrated in FIG. 4A.

In the initialization period INI, the n−1st scan signal Scan(n−1) and the n+1st emission signal EM(n+1) may each have a gate-on voltage, and the nth scan signal Scan(n) and the nth emission signal EM(n) may each have a gate-off voltage. For example, the gate-on voltage may be a logic low voltage VL and may be −8V, and the gate-off voltage may be a logic high voltage VH and may be 8V. However, the present embodiment is not limited thereto.

The first transistor T1, the fifth transistor T5, and the seventh transistor T7 may be turned on by the gate-on voltage applied through the n−1st scan line, and the fourth transistor T4 may be turned on by the gate-on voltage applied through the n+1st emission line. An initialization voltage Vini may be applied to the second node N2 through the turned-on first transistor T1, fourth transistor T4, and fifth transistor T5, and thus, the gate of the driving transistor DT may be initialized to the initialization voltage Vini. Also, the data voltage Vdata may be applied to the fifth node T5 through the turned-on transistor T7, thereby preventing changing of the second node N2. In this case, the initialization voltage Vini may be a voltage which is equal to or lower than the low-level power voltage VSS. For example, the initialization voltage Vini may be a voltage of −4V to −3V, and the data voltage Vdata may be a voltage which varies within a range of 0.3V to 6.3V, based on luminance.

During the initialization period INI, the gate of the driving transistor DT may be initialized based on the initialization voltage Vini, and the capacitor Cst may be charged with the initialization voltage Vini and the data voltage Vdata.

Figure 5A:
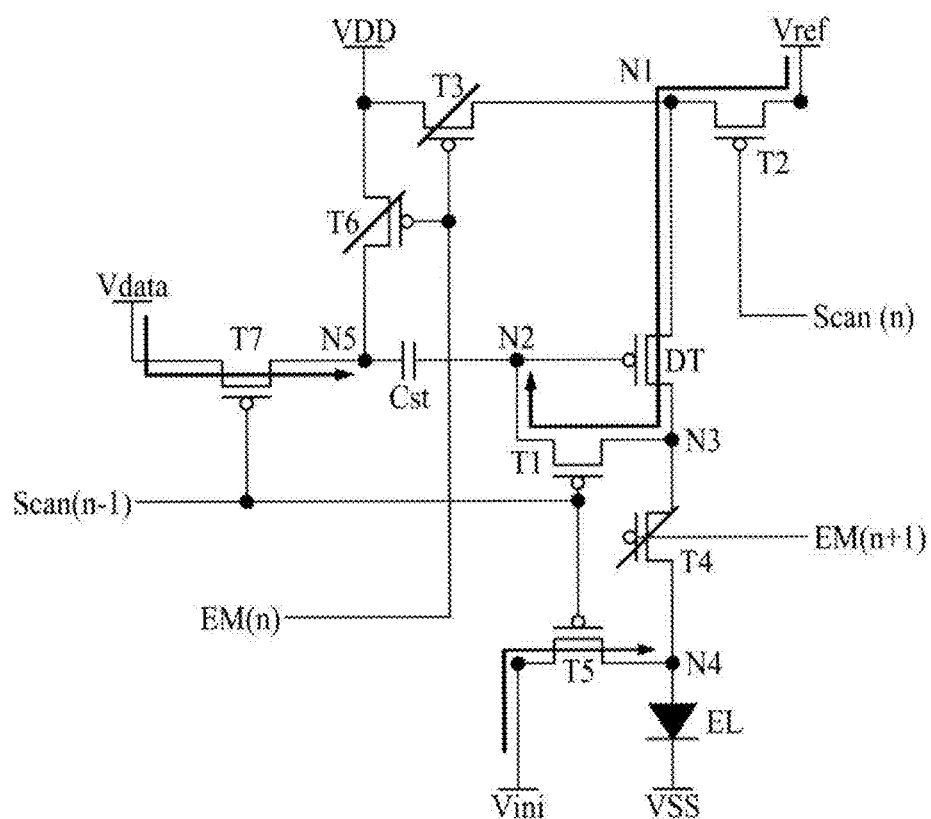
FIG. 5A is a diagram for describing driving of a subpixel according to a first embodiment of the present disclosure in a sampling period.
Figure 5B:
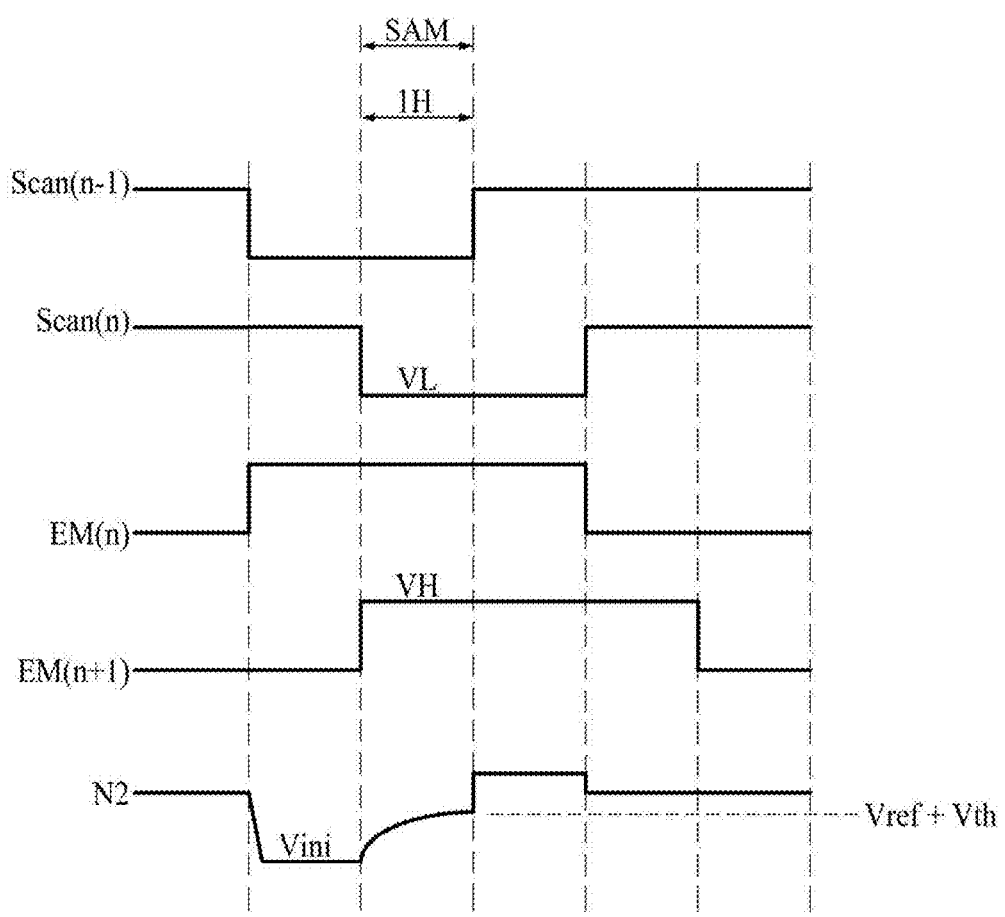
FIG. 5B is a waveform diagram for describing driving of the subpixel illustrated in FIG. 5A.

FIG. 5A is a diagram for describing driving of the subpixel according to the first embodiment of the present disclosure in the sampling period. FIG. 5B is a waveform diagram for describing driving of the subpixel illustrated in FIG. 5A.

In the sampling period SAM, the n−1st scan signal Scan(n−1) and the nth scan signal Scan(n) may each have a gate-on voltage, and the nth emission signal EM(n) and the n+1st emission signal EM(n+1) may each have a gate-off voltage. A period where the n−1st scan signal Scan(n−1) has the gate-on voltage and a period where the nth scan signal Scan(n) has the gate-on voltage may overlap each other in the sampling period SAM.

The first transistor T1, the fifth transistor T5, and the seventh transistor T7 may maintain a turn-on state with the gate-on voltage applied through the n−1st scan line, and the second transistor T2 may be turned on by the gate-on voltage applied through the nth scan line and may be in the diode connection state. The reference voltage Vref may be applied to the source of the driving transistor DT through the turned-on second transistor T2, and the gate and the drain of the driving transistor DT may be connected to each other by the turned-on first transistor T1, whereby the driving transistor DT may be turned on. A voltage of the second node N2 connected to the gate of the driving transistor DT may increase up to a sum of the reference voltage Vref and a threshold voltage Vth of the driving transistor DT. Also, the data voltage Vdata applied to the fifth node N5 in the initialization period INI may be maintained even in the sampling period SAM. Therefore, a voltage corresponding to the sum of the reference voltage Vref and the threshold voltage Vth of the driving transistor DT may be applied to the first electrode of the capacitor Cst, and the data voltage Vdata may be applied to the second electrode of the capacitor Cst, whereby the capacitor Cst may be charged with a difference voltage "Vdata-(Vref+Vth)" between the voltage applied to the first electrode and the data voltage applied to the second electrode. Also, the fifth transistor T5 may be turned on to initialize the anode of the light emitting device EL to the initialization voltage Vini. In this case, the reference voltage Vref may be a voltage which is higher than the low-level power voltage VSS and is lower than the high-level power voltage VDD. For example, the reference voltage Vref may be 4V, and the threshold voltage Vth may be −4V. However, the present embodiment is not limited thereto.

During the sampling period SAM, since the n−1st scan signal Scan(n−1) and the nth scan signal Scan(n) having the gate-on voltage are applied, one electrode of the capacitor Cst may be held by applying the data voltage Vdata to the fifth node N5, and by applying the reference voltage Vref to the source of the driving transistor DT, the second node N2 may sample the threshold voltage Vth of the driving transistor DT and may sense the reference voltage Vref.

Figure 6A:
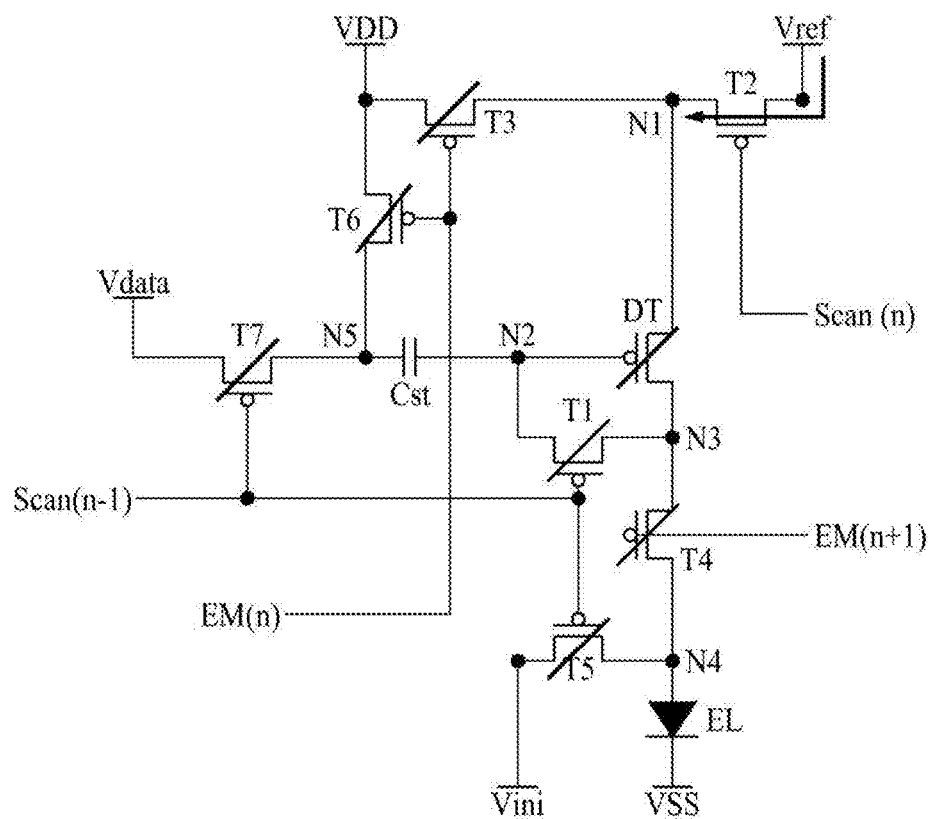
FIG. 6A is a diagram for describing driving of a subpixel according to a first embodiment of the present disclosure in a holding period.
Figure 6B:
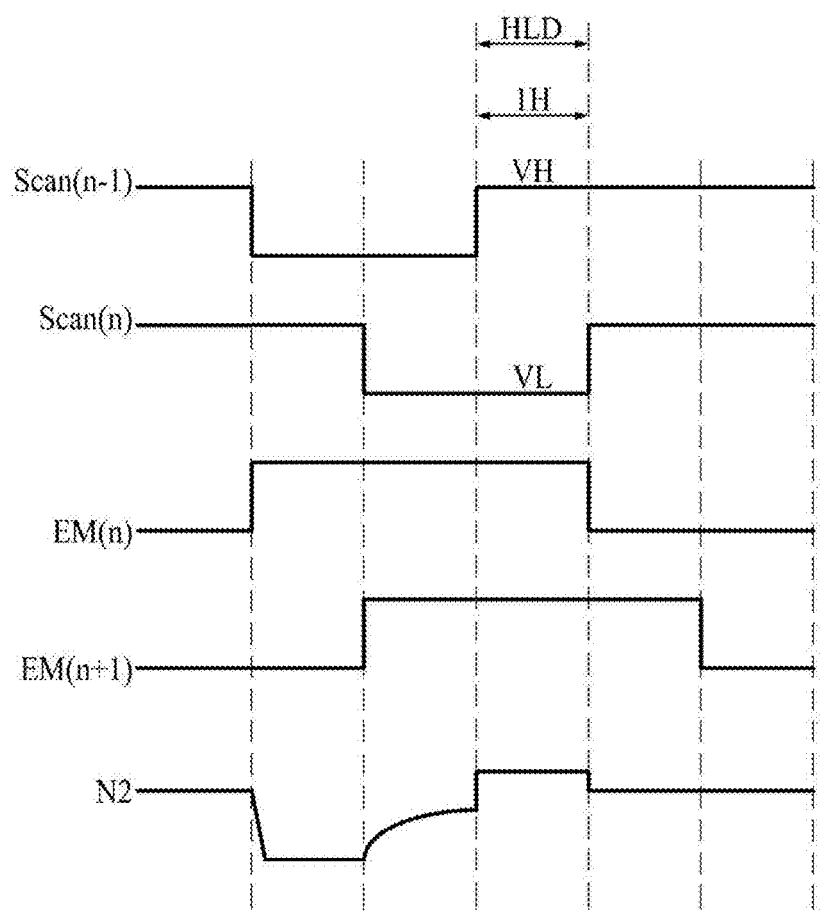
FIG. 6B is a waveform diagram for describing driving of the subpixel illustrated in FIG. 6A.

FIG. 6A is a diagram for describing driving of the subpixel according to the first embodiment of the present disclosure in the holding period. FIG. 6B is a waveform diagram for describing driving of the subpixel illustrated in FIG. 6A.

In the holding period HLD, the nth scan signal Scan(n) may have a gate-on voltage, and the n−1st scan signal Scan(n−1), the nth emission signal EM(n), and the n+1st emission signal EM(n+1) may each have a gate-off voltage.

The second transistor T2 may maintain a turn-on state with the gate-on voltage applied through the nth scan signal Scan(n). The reference voltage Vref may be applied to the first node N1 through the turned-on second transistor T2. In the holding period HLD, the capacitor Cst may be charged with the data voltage Vdata and may hold the data voltage Vdata, based on a voltage difference between both ends thereof. In the holding period HLD, the n−1st scan signal Scan(n−1) may be shifted from the gate-on voltage to the gate-off voltage, and thus, a voltage at the gate of the driving transistor DT may slightly vary due to a parasitic capacitor of the first transistor T1. In this case, the driving transistor DT may be in a turn-off state.

Figure 7A:
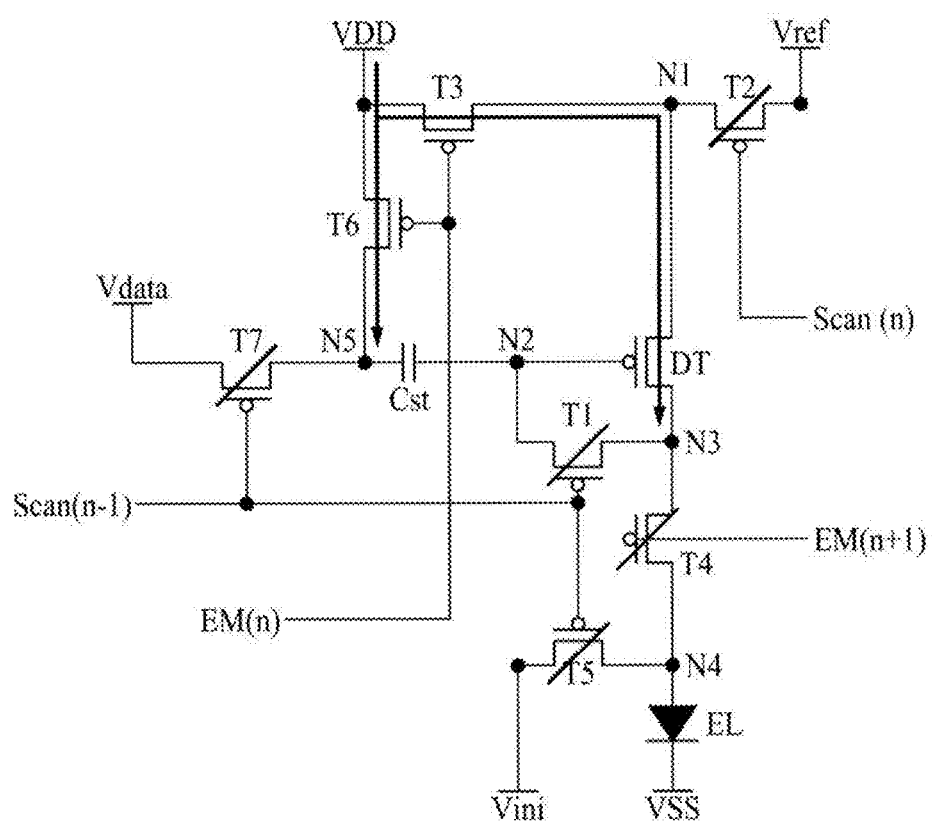
FIG. 7A is a diagram for describing driving of a subpixel according to a first embodiment of the present disclosure in a programming period.
Figure 7B:
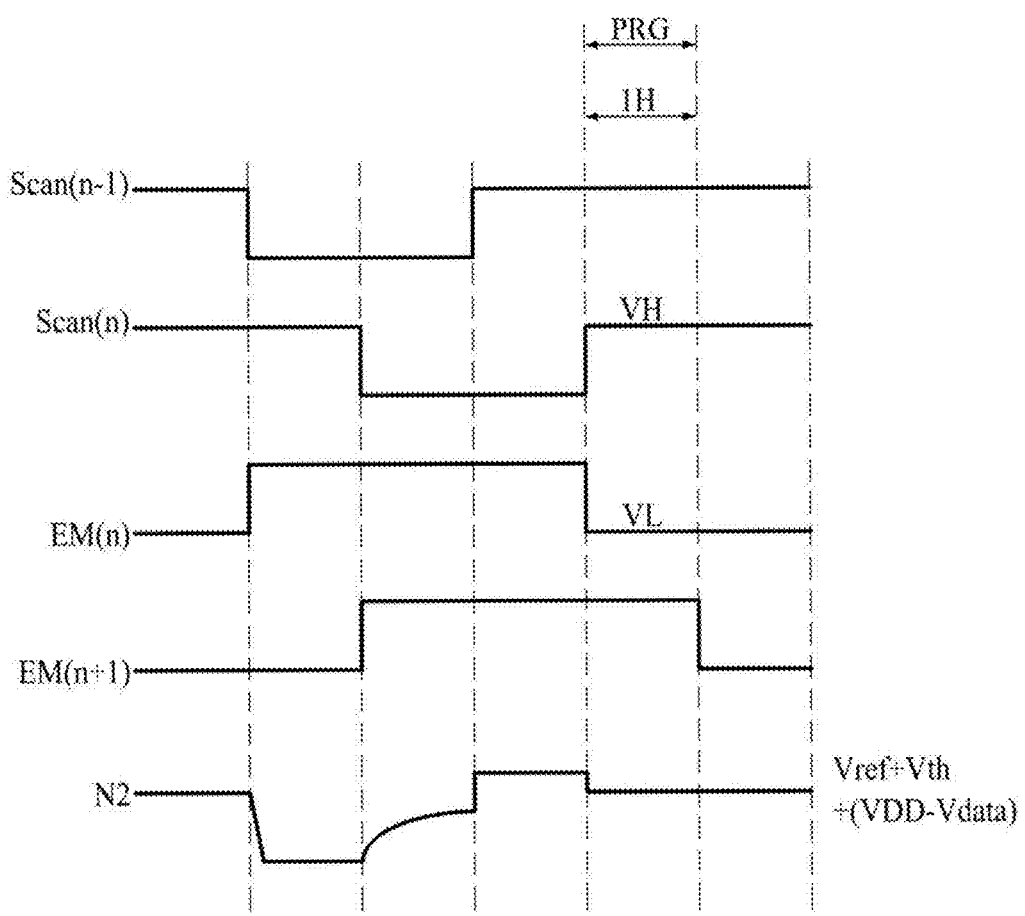
FIG. 7B is a waveform diagram for describing driving of the subpixel illustrated in FIG. 7A.

FIG. 7A is a diagram for describing driving of the subpixel according to the first embodiment of the present disclosure in the programming period. FIG. 7B is a waveform diagram for describing driving of the subpixel illustrated in FIG. 7A.

In the programming period PRG, the nth emission signal EM(n) may have a gate-on voltage, and the n−1st scan signal Scan(n−1), the nth scan signal Scan(n), and the n+1st emission signal EM(n+1) may each have a gate-off voltage.

The third transistor T3 and the sixth transistor T6 may be turned on by the gate-on voltage of the nth emission signal EM(n) applied thereto. The high-level power voltage VDD may be applied to the first node N1 through the turned-on third transistor T3, and the high-level power voltage VDD may be applied to the fifth node N5 through the turned-on sixth transistor T6. A voltage of the fifth node N5 connected to the second electrode of the capacitor Cst may be shifted from the data voltage Vdata to the high-level power voltage VDD, and due to coupling of the capacitor Cst, a voltage at the first electrode of the capacitor Cst may vary by a voltage variation of the fifth node N5. Therefore, a voltage of the second node N2 connected to the first electrode of the capacitor Cst may become "Vref+Vth+(VDD−Vdata)". In this case, since the high-level power voltage VDD is applied to the source of the driving transistor DT, the driving transistor DT may be turned on, but since the fourth transistor T4 is in a turn-off state, the light emitting device EL may not emit light. For example, the high-level power voltage VDD may be 4.6V, but is not limited thereto.

Figure 8A:
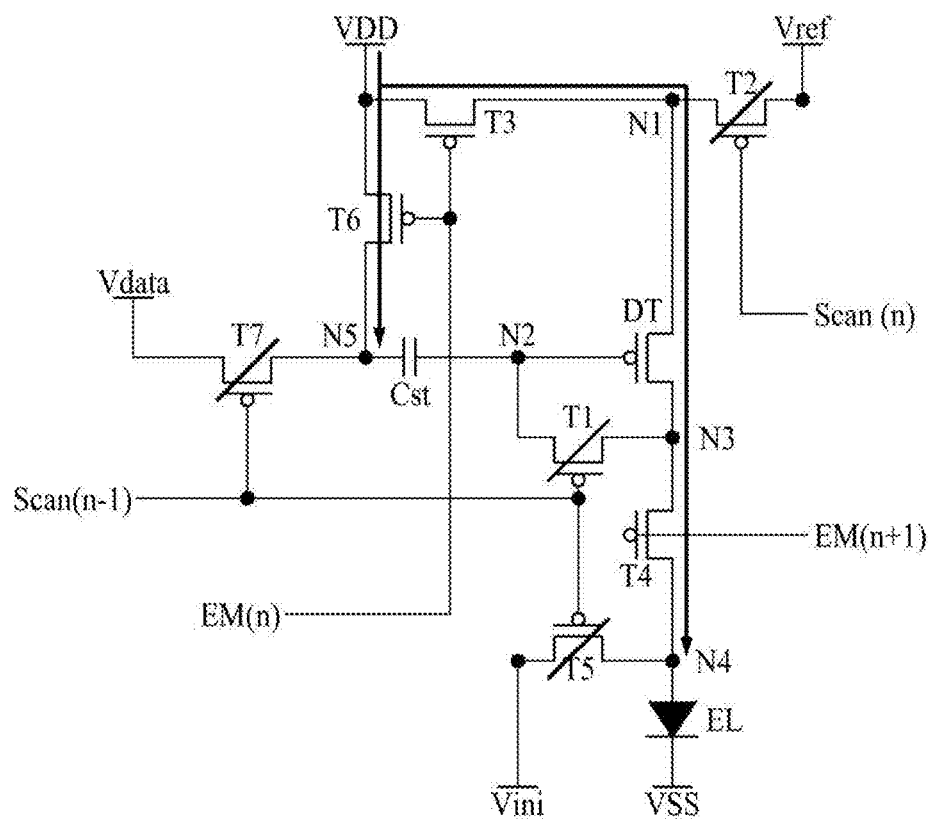
FIG. 8A is a diagram for describing driving of a subpixel according to a first embodiment of the present disclosure in an emission period.
Figure 8B:
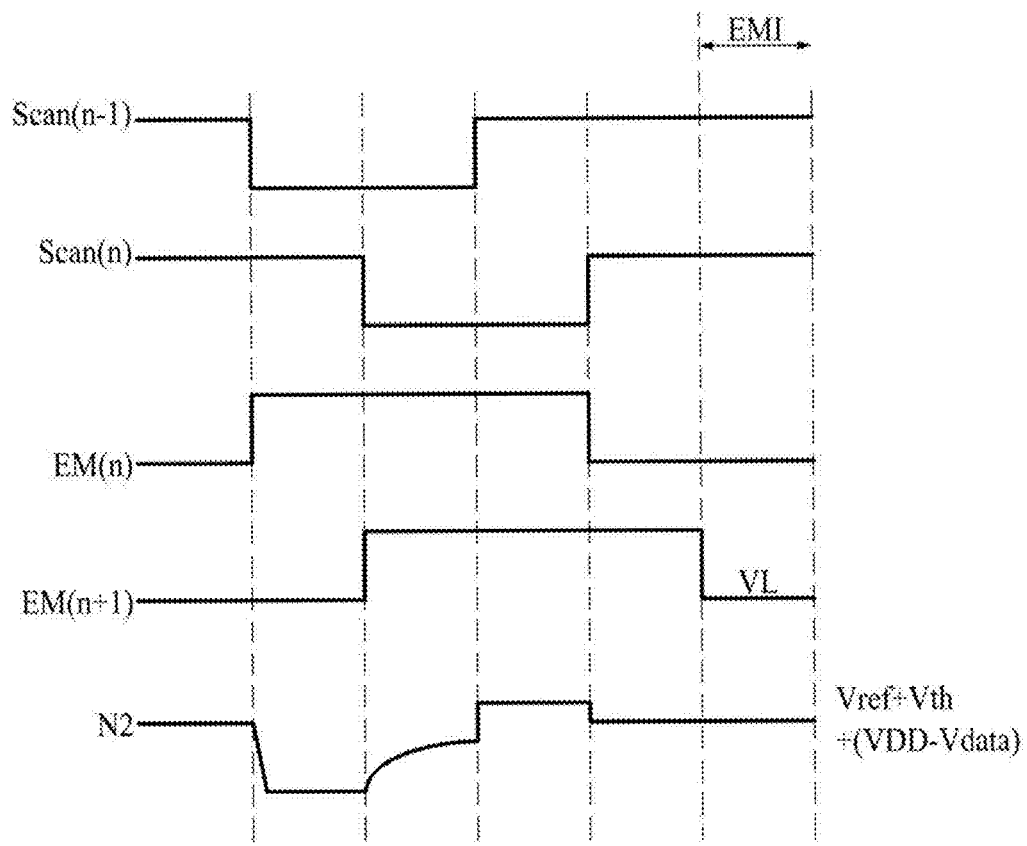
FIG. 8B is a waveform diagram for describing driving of the subpixel illustrated in FIG. 8A.

FIG. 8A is a diagram for describing driving of the subpixel according to the first embodiment of the present disclosure in the emission period. FIG. 8B is a waveform diagram for describing driving of the subpixel illustrated in FIG. 8A.

In the emission period EMI, the nth emission signal EM(n) and the n+1st emission signal EM(n+1) may each have a gate-on voltage, and the n−1st scan signal Scan(n−1) and the nth scan signal Scan(n) may each have a gate-off voltage.

The third transistor T3 and the sixth transistor T6 may maintain a turn-on state with the gate-on voltage of the nth emission signal EM(n) applied thereto. Therefore, the second electrode of the capacitor Cst and the source of the driving transistor DT may maintain the high-level power voltage VDD, and thus, the driving transistor DT may maintain a turn-on state. Also, the fourth transistor T4 may be turned on by the gate-on voltage of the n+1st emission signal EM(n+1) applied thereto, and thus, may allow a current to flow between the third node N3 and the fourth node N4. Accordingly, a driving current generated in the turned-on driving transistor DT may be applied to the anode of the light emitting device EL through the fourth transistor T4 to allow the light emitting device EL to emit light. Also, by connecting the gate of the fourth transistor T4 to the n+1st emission signal line, the gate of the driving transistor DT may be initialized in the initialization period INI, and the driving current may be applied to the anode of the light emitting device EL in the emission period EMI.

In the nth subpixel SP according to the first embodiment of the present disclosure, the high-level power voltage VDD may be reflected in each of the source and the gate of the driving transistor DT through the holding period HLD, in order to consider the voltage drop of the high-level power voltage VDD. Therefore, a current of the nth subpixel SP which has been compensated for may be expressed as the following Equation:

$$Ioled = K(Vgs-Vth)^2 = K\{(Vref+Vth+(VDD-Vdata))-VDD-Vth\}^2 = K(Vref-Vdata)^2$$

where Ioled denotes a current flowing through the light emitting device EL, K denotes a constant, Vgs denotes a voltage between the gate and the source of the driving transistor DT, Vth denotes the threshold voltage of the driving transistor DT, VDD denotes the high-level power voltage applied through the high level power line VDDL, Vref denotes the reference voltage applied through the reference voltage line VrefL, and Vdata denotes a data voltage applied through the data line DL.

As seen in the Equation, Ioled may be determined based on a difference between the reference voltage and the data voltage. According to the Equation, in the nth subpixel SP according to the first embodiment of the present disclosure, it can be seen that the voltage drop of the high-level power voltage is compensated for, based on the high-level power voltage VDD which is applied to the gate and the source of the driving transistor DT in the holding period HLD and the reference voltage Vref which is applied to the source of the driving transistor DT in the sampling period SAM and the holding period HLD.

Therefore, a driving circuit for compensating for a sequential shift characteristic based on the voltage drop of the high-level power voltage may be implemented, and thus, an image quality issue such as the vertical luminance non-uniformity or crosstalk of a display device is solved. Moreover, the second and third transistors T2 and T3 of the plurality of transistors configuring the nth subpixel SP according to the first embodiment of the present disclosure may be disposed on one side of the non-display area and may be used in common by q (where q is an integer equal to or more than two) number of subpixels disposed on an nth pixel line. Also, in a case where the gate driver 130 is disposed on each of the left and the right, the second and third transistors T2 and T3 may be disposed in each of a left non-display area and a right non-display area and may be used in common by q/2 number of subpixels. Therefore, the number of transistors configuring each subpixel is reduced, and thus, each subpixel is efficiently designed, thereby implementing a high-resolution display device. In this case, the other transistors (which area driving transistor DT, first transistor T1, fourth transistor T4, fifth transistor T5, sixth transistor T6, seventh transistor T7) except for the second and third transistors T2 and T3 among the plurality of transistors, the light emitting device EL and the capacitor Cst configuring the nth subpixel SP may be necessary for an individual operation of each subpixel SP are disposed in the display area, and thus, cannot be used in common by the nth pixel line. Accordingly, since the second and third transistors T2 and T3 are disposed in the non-display area DA, the high-resolution display device may be implemented.

Figure 9:
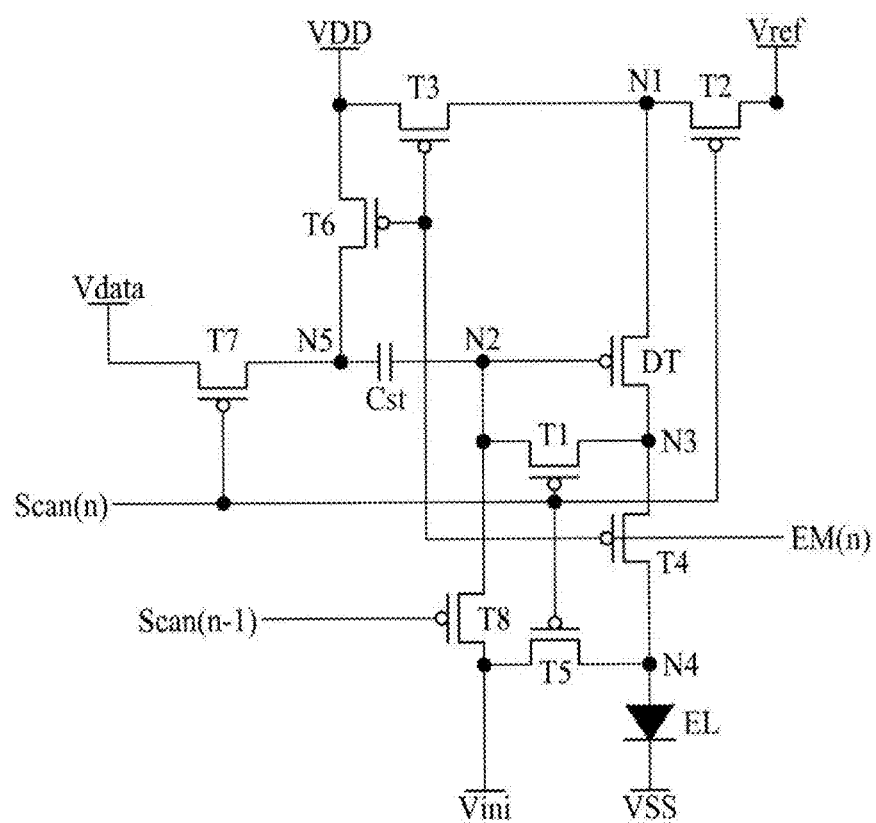
FIG. 9 is a circuit diagram of a subpixel according to a second embodiment of the present disclosure.

FIG. 9 is a circuit diagram of a subpixel according to a second embodiment of the present disclosure. FIG. 9 is a modification example where one transistor is added to the pixel circuit of FIG. 3, and thus, overlapping descriptions are omitted or will be briefly described.

An nth subpixel SP according to a second embodiment of the present disclosure may include first to eighth transistors T1 to T8, a driving transistor DT, a capacitor Cst, and a light emitting device EL. In the second embodiment of the present disclosure, the nth subpixel SP may be implemented based on a total of nine transistors and one capacitor.

The driving transistor DT may include a source connected to a first node N1, a gate connected to a second node N2, and a drain connected to a third node N3. When a gate-on voltage is applied to the second node N2, the driving transistor DT may be turned on to provide a constant current to the third node N3.

The first transistor T1 may include a gate connected to an nth scan line, a source connected to the second node N2, and a drain connected to the third node N3. The first transistor T1 may be turned on in response to a gate-on voltage of an nth scan signal Scan(n) applied through the nth scan line. When the first transistor T1 is turned on, the gate and the drain of the driving transistor DT may be electrically connected to each other, and thus, the driving transistor DT may be in a diode connection state.

The second transistor T2 may include a gate connected to the nth scan line, a source connected to a reference voltage line, and a drain connected to the first node N1. The second transistor T2 may be turned on in response to a gate-on voltage of an nth scan signal Scan(n) applied through the nth scan line. When the second transistor T2 is turned on, a reference voltage Vref may be applied to the first node N1.

The third transistor T3 may include a gate connected to an nth emission line, a source connected to a high level power line, and a drain connected to the first node N1. The third transistor T3 may be turned on in response to a gate-on voltage of an nth emission signal EM(n) applied through the nth emission line. When the third transistor T3 is turned on, a high-level power voltage VDD may be applied to the first node N1.

The fourth transistor T4 may include a gate connected to an nth emission line, a source connected to the third node N3, and a drain connected to a fourth node N4. In this case, the fourth node N4 may be connected to an anode of the light emitting device EL. The fourth transistor T4 may be turned on in response to a gate-on voltage of the nth emission signal EM(n) applied through the nth emission line. When the fourth transistor T4 is turned on, a current may flow between the third node N3 and the fourth node N4.

The light emitting device EL may include the anode connected to the fourth node N4 and a cathode to which a low-level power voltage VSS is applied. When the fourth transistor T4 is turned on, a driving current generated through the driving transistor DT may be applied to the anode of the light emitting device EL, and thus, the light emitting device EL may emit light. For example, the low-level power voltage VSS may be a voltage of −4V to −2.5V.

The fifth transistor T5 may include a gate connected to the nth scan line, a source connected to the anode of the light emitting device EL, and a drain connected to an initialization line. The fifth transistor T5 may be turned on in response to the gate-on voltage of the nth scan signal Scan(n) applied through the nth scan line. When the fifth transistor T5 is turned on, the anode of the light emitting device EL may be initialized based on an initialization voltage.

The sixth transistor T6 may include a gate connected to the nth emission line, a source connected to the high level power line, and a drain connected to a fifth node N5. The sixth transistor T6 may be turned on in response to the gate-on voltage of the nth emission signal EM(n) applied through the nth emission line. When the sixth transistor T6 is turned on, the high-level power voltage VDD may be applied to the fifth node N5.

The capacitor Cst may include a first electrode connected to the second node N2 and a second electrode connected to the fifth node N5.

The seventh transistor T7 may include a gate connected to the nth scan line, a source connected to a data line, and a drain connected to the fifth node N5. The seventh transistor T7 may be turned on in response to the gate-on voltage of the nth scan signal Scan(n) applied through the nth scan line. When the seventh transistor T7 is turned on, a data voltage Vdata may be applied to the fifth node N5.

The eighth transistor T8 may include a gate connected to an n−1st scan line, a source connected to the second node N2, and a drain connected to an initialization line. The eighth transistor T8 may be turned on in response to the gate-on voltage of an n−1st scan signal Scan(n−1) applied through the n−1st scan line. When the eighth transistor T8 is turned on, an initialization voltage Vini may be applied to the second node N2.

Moreover, a voltage applied to the gate of the driving transistor DT may control a turn-on state of the driving transistor DT, and thus, a transistor including a source or a drain connected to the gate of the driving transistor DT may include two or more transistors serially connected to each other, for maximally suppressing an influence of a leakage current. In this case, the two or more transistors may be controlled by the same control signal. Accordingly, in the nth subpixel SP according to the second embodiment of the present disclosure, the first transistor T1 and the eighth transistor T8 may each be implemented as a double-gate type transistor.

The nth subpixel SP according to the second embodiment of the present disclosure may operate in the order of an initialization period, a sampling period, a holding period, and an emission period. The initialization period may be a period where the gate of the driving transistor DT is initialized, the sampling period may be a period where a threshold voltage of the driving transistor DT is sampled and a data voltage Vdata is applied through a data line, and the holding period may be a period where the data voltage Vdata is held by a specific node and undesired emission of light caused by a delay of the scan signal is prevented. Also, the emission period may be a period where the light emitting device EL emits light with a driving current generated based on the data voltage Vdata.

The nth subpixel SP according to the second embodiment of the present disclosure may have an initialization period INI and a sampling period SAM during a period where a gate-off voltage of the nth emission signal EM(n) is applied, and thus, compensation based on an internal circuit may be performed. An operation characteristic during the periods will be described below. For example, a gate-on voltage of the scan signal may be applied during one horizontal periods 1H, and a gate-off voltage of an emission signal may be applied during three horizontal periods 3H. Also, for example, each of the initialization period INI, the sampling period SAM, and the holding period HLD may be executed during one horizontal period 1H. Driving of the pixel circuit will be described below with reference to the drawings.

Figure 10A:
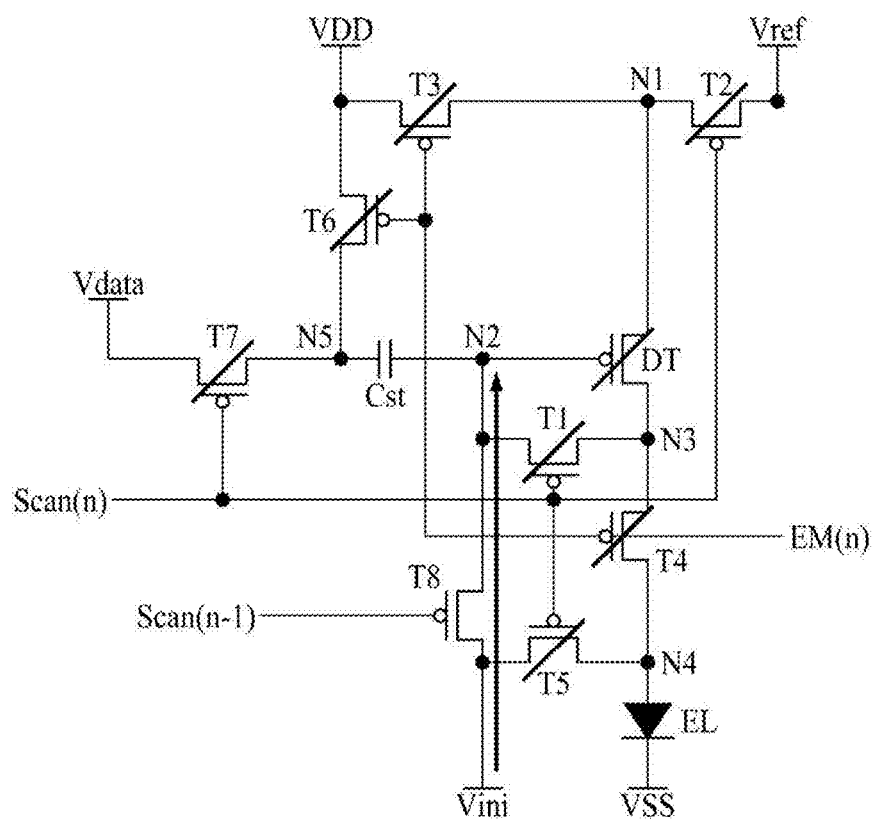
FIG. 10A is a diagram for describing driving of a subpixel according to a second embodiment of the present disclosure in an initialization period.

FIG. 10A is a diagram for describing driving of the subpixel according to the second embodiment of the present disclosure in the initialization period. FIG. 10B is a waveform diagram for describing driving of the subpixel illustrated in FIG. 10A.

In the initialization period INI, the n−1st scan signal Scan(n−1) may have a gate-on voltage, and the nth scan signal Scan(n) and the nth emission signal EM(n) may each have a gate-off voltage. For example, the gate-on voltage may be a logic low voltage VL and may be −8V, and the gate-off voltage may be a logic high voltage VH and may be 8V. However, the present embodiment is not limited thereto.

The eighth transistor T8 may be turned on by the gate-on voltage applied through the n−1st scan line. An initialization voltage Vini may be applied to the second node N2 through the turned-on eighth transistor T8, and thus, the gate of the driving transistor DT may be initialized to the initialization voltage Vini. In this case, the initialization voltage Vini may be a voltage which is equal to or lower than the low-level power voltage VSS. For example, the initialization voltage Vini may be a voltage of −4V to −3V, and the data voltage Vdata may be a voltage which varies within a range of 0.3V to 6.3V, based on luminance.

During the initialization period INI, the gate of the driving transistor DT may be initialized based on the initialization voltage Vini.

Figure 11A:
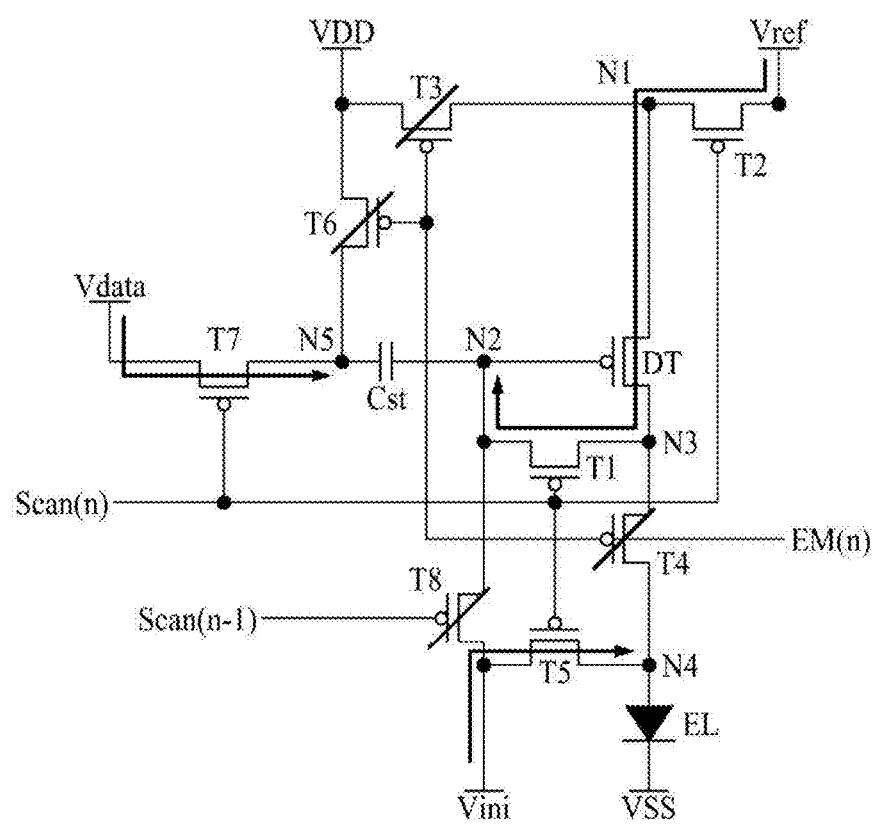
FIG. 11A is a diagram for describing driving of a subpixel according to a second embodiment of the present disclosure in a sampling period.
Figure 11B:
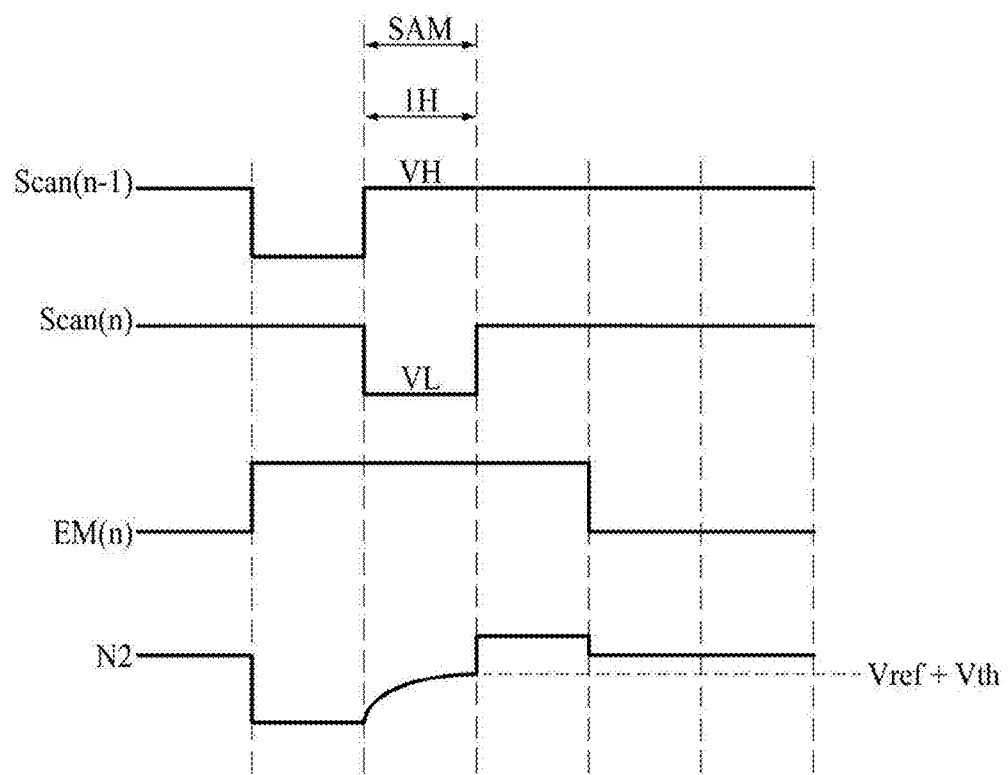
FIG. 11B is a waveform diagram for describing driving of the subpixel illustrated in FIG. 11A.

FIG. 11A is a diagram for describing driving of the subpixel according to the second embodiment of the present disclosure in the sampling period. FIG. 11B is a waveform diagram for describing driving of the subpixel illustrated in FIG. 11A.

In the sampling period SAM, the nth scan signal Scan(n) may have a gate-on voltage, and the n−1st scan signal Scan(n−1) and the nth emission signal EM(n) may each have a gate-off voltage.

The first transistor T1, the second transistor T2, the fifth transistor T5, and the seventh transistor T7 may be turned on by the gate-on voltage applied through the nth scan line. The reference voltage Vref may be applied to the source of the driving transistor DT through the turned-on second transistor T2, and the gate and the drain of the driving transistor DT may be connected to each other by the turned-on first transistor T1, whereby the driving transistor DT may be turned on and may be in the diode connection state. A voltage of the second node N2 connected to the gate of the driving transistor DT may increase up to a sum of the reference voltage Vref and a threshold voltage Vth of the driving transistor DT. Also, the data voltage Vdata may be applied to the fifth node N5 through the turned-on seventh transistor T7. Therefore, a voltage corresponding to the sum of the reference voltage Vref and the threshold voltage Vth of the driving transistor DT may be applied to the first electrode of the capacitor Cst, and the data voltage Vdata may be applied to the second electrode of the capacitor Cst, whereby the capacitor Cst may be charged with a difference voltage "Vdata−(Vref+Vth)" between the voltage applied to the first electrode and the data voltage applied to the second electrode. Also, the fifth transistor T5 may be turned on to initialize the anode of the light emitting device EL to the initialization voltage Vini. In this case, the reference voltage Vref may be a voltage which is higher than the low-level power voltage VSS and is lower than the high-level power voltage VDD. For example, the reference voltage Vref may be 4V, and the threshold voltage Vth may be −4V. However, the present embodiment is not limited thereto.

During the sampling period SAM, since the nth scan signal Scan(n) having the gate-on voltage is applied, one electrode of the capacitor Cst may be held by applying the data voltage Vdata to the fifth node N5, and by applying the reference voltage Vref to the source of the driving transistor DT, the second node N2 may sample the threshold voltage Vth of the driving transistor DT and may sense the reference voltage Vref.

Figure 12A:
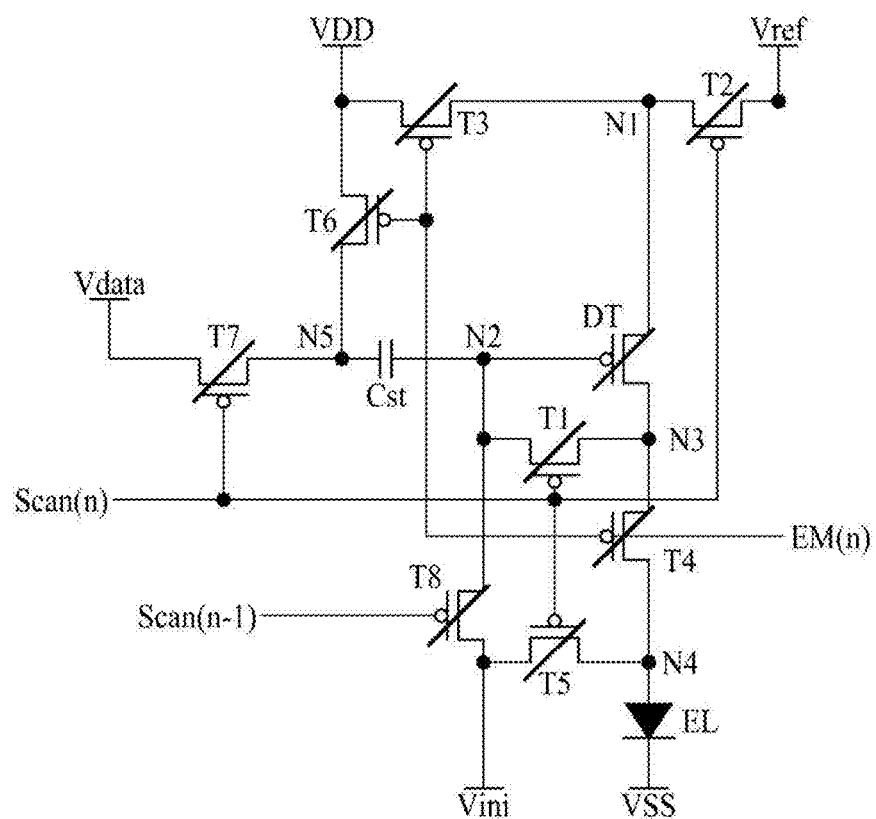
FIG. 12A is a diagram for describing driving of a subpixel according to a second embodiment of the present disclosure in a holding period.
Figure 12B:
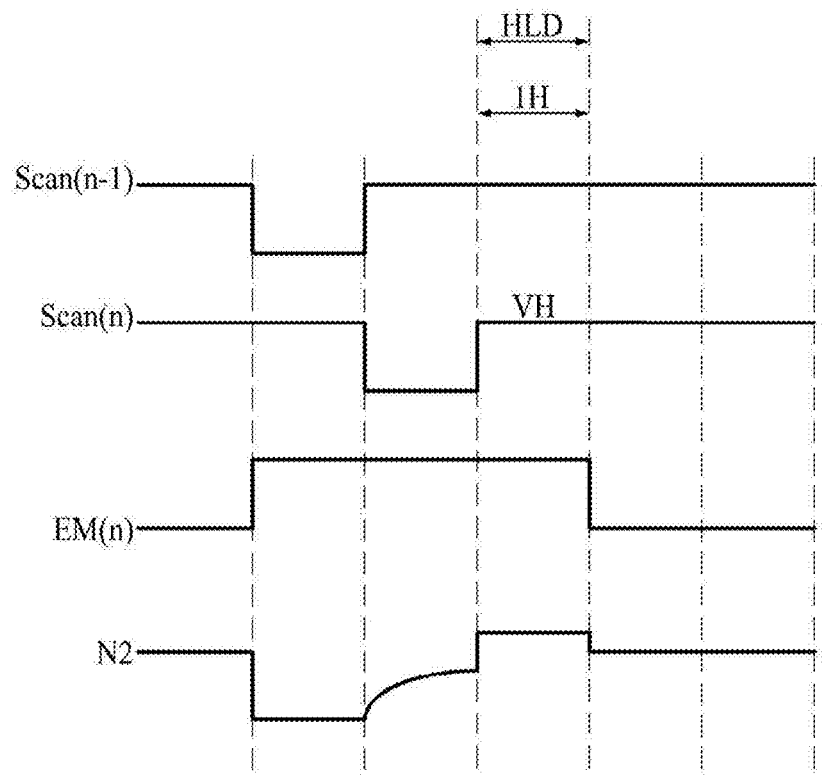
FIG. 12B is a waveform diagram for describing driving of the subpixel illustrated in FIG. 12A.

FIG. 12A is a diagram for describing driving of the subpixel according to the second embodiment of the present disclosure in the holding period. FIG. 12B is a waveform diagram for describing driving of the subpixel illustrated in FIG. 12A.

In the holding period HLD, the n−1st scan signal Scan(n−1), the nth scan signal Scan(n), and the nth emission signal EM(n) may each have a gate-on voltage, and thus, the first to eighth transistors T1 to T8 may be turned off.

In the holding period HLD, the nth scan signal Scan(n) may be shifted from the gate-on voltage to the gate-off voltage, and thus, a voltage at the gate of the driving transistor DT may slightly vary due to a parasitic capacitor of the first transistor T1. In this case, the driving transistor DT may be in a turn-off state.

For example, if the nth emission signal EM(n) is shifted to the gate-on voltage at a time when the nth scan signal Scan(n) is shifted from the gate-on voltage to the gate-off voltage, a sampling error occurs. The reason is because, as illustrated, the nth scan signal Scan(n) is not ideally shifted from a logic low voltage to a logic high voltage, and a time when the logic low voltage is shifted to the logic high voltage is delayed due to RC delay. In this case, if the nth emission signal EM(n) is shifted to the gate-on voltage, undesired emission of light occurs. Accordingly, the subpixel according to the second embodiment of the present disclosure may include the holding period HLD, thereby preventing undesired emission of light caused by a delay of a scan signal.

Figure 13A:
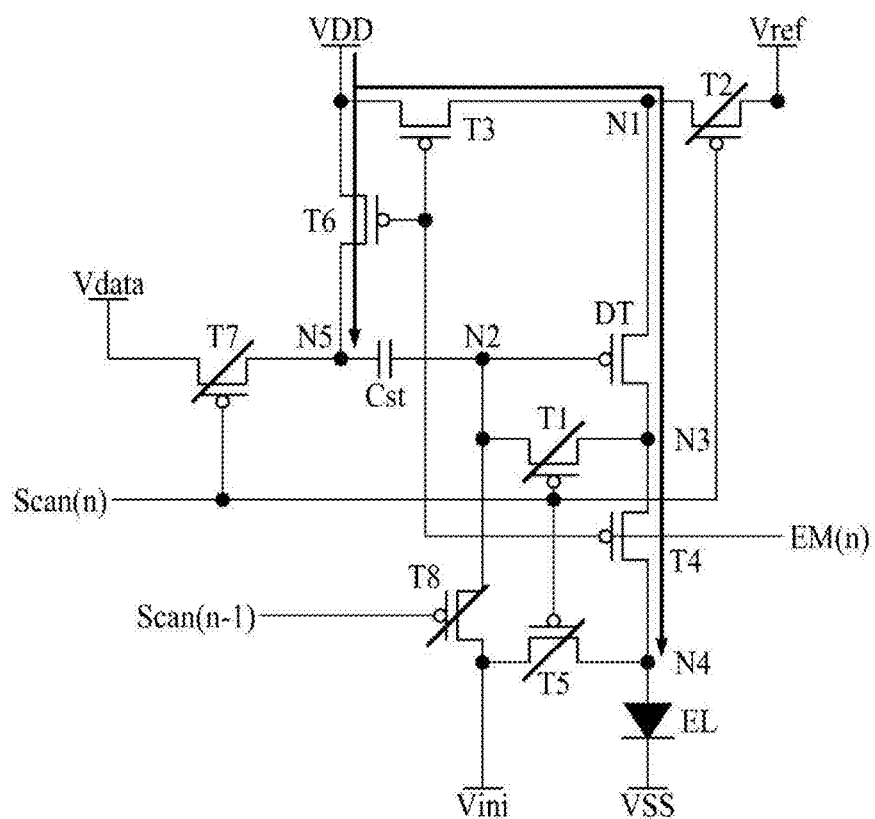
FIG. 13A is a diagram for describing driving of a subpixel according to a second embodiment of the present disclosure in an emission period.
Figure 13B:
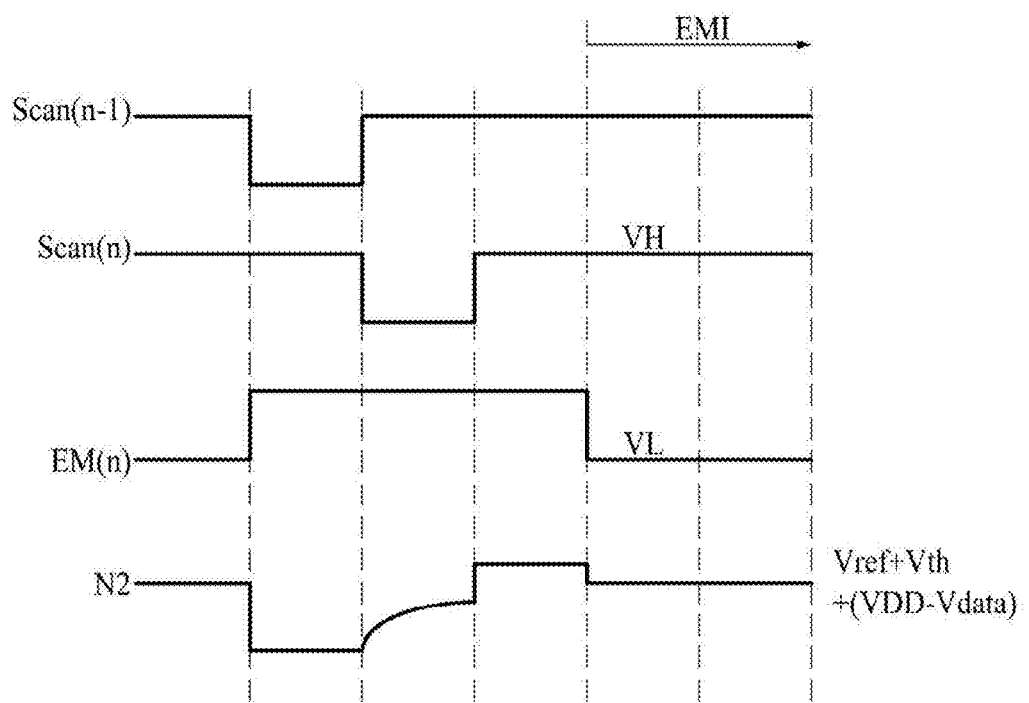
FIG. 13B is a waveform diagram for describing driving of the subpixel illustrated in FIG. 13A.

FIG. 13A is a diagram for describing driving of the subpixel according to the second embodiment of the present disclosure in the emission period. FIG. 13B is a waveform diagram for describing driving of the subpixel illustrated in FIG. 13A.

In the emission period EMI, the nth emission signal EM(n) may have a gate-on voltage.

The third transistor T3, the fourth transistor T4, and the sixth transistor T6 may be turned on by the gate-on voltage of the nth emission signal EM(n) applied thereto. Therefore, the high-level power voltage VDD may be applied to the second electrode of the capacitor Cst, and thus, due to coupling of the capacitor Cst, a voltage of the second node N2 may become "Vref+Vth+(Vdd−Vdata)". Also, the high-level power voltage VDD may be applied to the source of the driving transistor DT, and thus, the driving transistor DT may be turned on. Also, the fourth transistor T4 may be turned on, and thus, may allow a current to flow between the third node N3 and the fourth node N4. Accordingly, a driving current generated in the turned-on driving transistor DT may be applied to the anode of the light emitting device EL through the fourth transistor T4 to allow the light emitting device EL to emit light.

A current of the nth subpixel SP according to the second embodiment of the present disclosure may be expressed as the following Equation:

$$\text{Ioled} = K(\text{Vgs}-\text{Vth})^2 = K\{(\text{Vref}+\text{Vth}+(\text{VDD}-\text{Vdata}))-\text{VDD}-\text{Vth}\}^2 = K(\text{Vref}-\text{Vdata})^2$$

where Ioled denotes a current flowing through the light emitting device EL, K denotes a constant, Vgs denotes a voltage between the gate and the source of the driving transistor DT, Vth denotes the threshold voltage of the driving transistor DT, VDD denotes the high-level power voltage applied through the high level power line VDDL, Vref denotes the reference voltage applied through the reference voltage line VrefL, and Vdata denotes a data voltage applied through the data line DL. For example, the high-level power voltage VDD may be 4.6V.

As seen in the Equation, Ioled may be determined based on a difference between the reference voltage and the data voltage. According to the Equation, in the nth subpixel SP according to the second embodiment of the present disclosure, it can be seen that the voltage drop of the high-level power voltage is compensated for, based on the reference voltage Vref which is applied to the source of the driving transistor DT in the sampling period SAM and the high-level power voltage VDD which is applied to the gate and the source of the driving transistor DT in the emission period EMI.

Therefore, a driving circuit for compensating for a sequential shift characteristic based on the voltage drop of the high-level power voltage may be implemented, and thus, an image quality issue such as the vertical luminance non-uniformity or crosstalk of a display device is solved.

Moreover, since the nth subpixel SP according to the second embodiment of the present disclosure includes the eighth transistor T8, the gate of the driving transistor DT may be initialized without adding the n+1st emission signal EM(n+1), and thus, a size of an emission driver for providing an emission signal is reduced, thereby decreasing a size of a bezel which is a non-display area of an electroluminescent display device.

Moreover, the second and third transistors T2 and T3 of the plurality of transistors configuring the nth subpixel SP according to the second embodiment of the present disclosure may be disposed on one side of the non-display area and may be used in common by q number of subpixels disposed on an nth pixel line. Also, in a case where the gate driver 130 is disposed on each of the left and the right, the second and third transistors T2 and T3 may be disposed in each of a left non-display area and a right non-display area and may be used in common by q/2 number of subpixels. Therefore, the number of transistors configuring each subpixel is reduced, and thus, each subpixel is efficiently designed, thereby implementing a high-resolution display device. In this case, the other transistors (which are driving transistor DT, first transistor T1, fourth transistor T4, fifth transistor T5, sixth transistor T6, seventh transistor T7, the eight transistor T8) except for the second and third transistors T2 and T3 among the plurality of transistors, the light emitting device EL and the capacitor Cst configuring the nth subpixel SP may be necessary for an individual operation of each subpixel SP are disposed in the display area, and thus, cannot be used in common by the nth pixel line. Accordingly, since the second and third transistors T2 and T3 are disposed in the non-display area, the high-resolution display device may be implemented.

Figure 14:
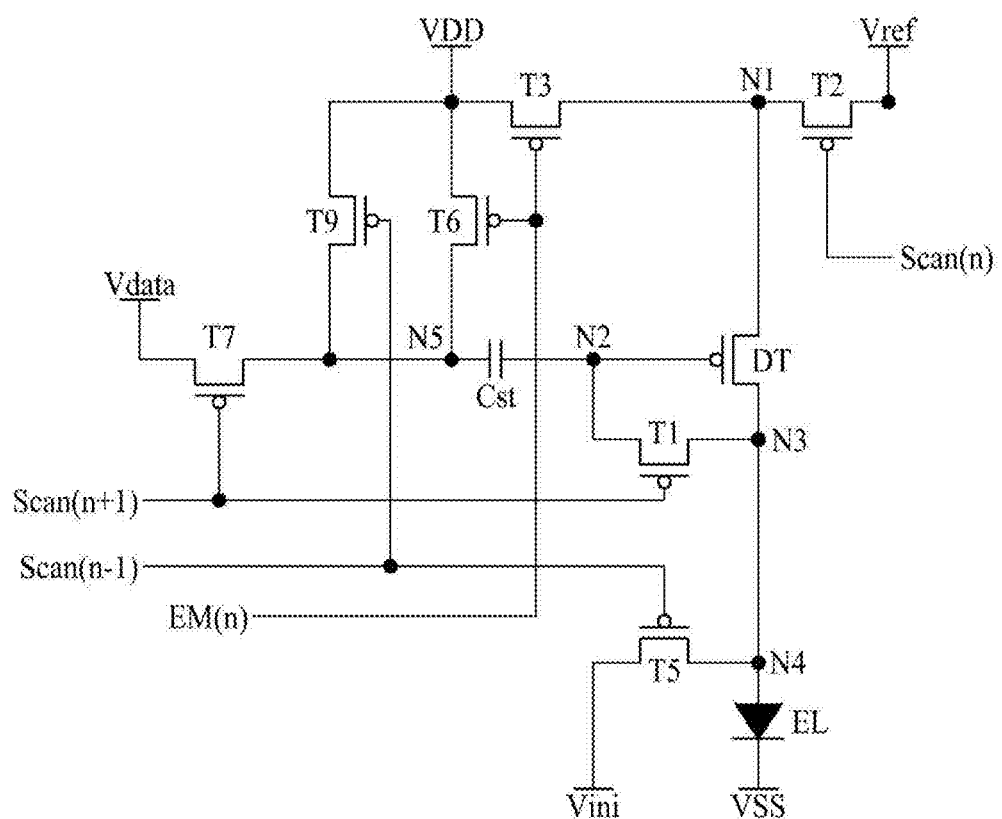
FIG. 14 is a circuit diagram of a subpixel according to a third embodiment of the present disclosure.

FIG. 14 is a circuit diagram of a subpixel according to a third embodiment of the present disclosure. In comparison with FIG. 3, an eighth transistor T8 is added to the subpixel of FIG. 14, and the fourth transistor T4 illustrated in FIG. 3 is not applied to the subpixel of FIG. 14. FIG. 14 is a modification example which is implemented by modifying the pixel circuit of FIG. 3, and thus, overlapping descriptions are omitted or will be briefly described.

An nth subpixel SP may include first to third transistors T1 to T3, fifth to seventh transistors T5 to T7, a ninth transistor T9, a driving transistor DT, a capacitor Cst, and a light emitting device EL. In the third embodiment of the present disclosure, the nth subpixel SP may be implemented based on a total of eight transistors and one capacitor.

The driving transistor DT may include a source connected to a first node N1, a gate connected to a second node N2, and a drain connected to a third node N3. When a gate-on voltage is applied to the second node N2, the driving transistor DT may be turned on to provide a constant current to the third node N3.

The first transistor T1 may include a gate connected to an n+1st scan line, a source connected to the second node N2, and a drain connected to the third node N3. The first transistor T1 may be turned on in response to a gate-on voltage of an n+1st scan signal Scan(n+1) applied through the n+1st scan line. When the first transistor T1 is turned on, the gate and the drain of the driving transistor DT may be electrically connected to each other, and thus, the driving transistor DT may be in a diode connection state.

The second transistor T2 may include a gate connected to an nth scan line, a source connected to a reference voltage line, and a drain connected to the first node N1. The second transistor T2 may be turned on in response to a gate-on voltage of an nth scan signal Scan(n) applied through the nth scan line. When the second transistor T2 is turned on, a reference voltage Vref may be applied to the first node N1.

The third transistor T3 may include a gate connected to an nth emission line, a source connected to a high level power line, and a drain connected to the first node N1. The third transistor T3 may be turned on in response to a gate-on voltage of an nth emission signal EM(n) applied through the nth emission line. When the third transistor T3 is turned on, a high-level power voltage VDD may be applied to the first node N1.

The fifth transistor T5 may include a gate connected to an n−1st scan line, a source connected to a fourth node N4, and a drain connected to an initialization line. The fifth transistor T5 may be turned on in response to the gate-on voltage of the n−1st scan signal Scan(n−1) applied through an n−1st scan line. When the fifth transistor T5 is turned on, the anode of the light emitting device EL may be initialized based on an initialization voltage. In this case, the fourth node N4 may be the same node as the third node N3.

The light emitting device EL may include the anode connected to the fourth node N4 and a cathode to which a low-level power voltage VSS is applied. When a driving current generated through the driving transistor DT is applied to the anode of the light emitting device EL, the light emitting device EL may emit light. For example, the low-level power voltage VSS may be a voltage of −4V to −2.5V.

The sixth transistor T6 may include a gate connected to the nth emission line, a source connected to the high level power line, and a drain connected to a fifth node N5. The sixth transistor T6 may be turned on in response to the gate-on voltage of the nth emission signal EM(n) applied through the nth emission line. When the sixth transistor T6 is turned on, the high-level power voltage VDD may be applied to the fifth node N5.

The capacitor Cst may include a first electrode connected to the second node N2 and a second electrode connected to the fifth node N5.

The ninth transistor T9 may include a gate connected to the n−1st scan line, a source connected to the high level power line, and a drain connected to the fifth node N5. The ninth transistor T9 may be turned on in response to the gate-on voltage of the n−1st scan signal Scan(n−1) applied through the n−1st scan line. When the ninth transistor T9 is turned on, a high-level power voltage VDD may be applied to the fifth node N5.

The seventh transistor T7 may include a gate connected to the n+1st scan line, a source connected to a data line, and a drain connected to the fifth node N5. The seventh transistor T7 may be turned on in response to the gate-on voltage of the n+1st scan signal Scan(n+1) applied through the n+1st scan line. When the seventh transistor T7 is turned on, a data voltage Vdata may be applied to the fifth node N5.

Moreover, a voltage applied to the gate of the driving transistor DT may control a turn-on state of the driving transistor DT, and thus, a transistor including a source or a drain connected to the gate of the driving transistor DT may include two or more transistors serially connected to each other, for maximally suppressing an influence of a leakage current. In this case, the two or more transistors may be controlled by the same control signal. Accordingly, in the nth subpixel SP according to the third embodiment of the present disclosure, the first transistor T1 may be implemented as a double-gate type transistor.

The nth subpixel SP according to the third embodiment of the present disclosure may operate in the order of an initialization period, a first holding period, a sampling period, a second holding period, and an emission period. The initialization period may be a period where the anode of the light emitting device EL is initialized, the first holding period may be a period where a reference voltage Vref is applied to the source of the driving transistor DT, and the sampling period may be a period where the data voltage Vdata is applied to a specific node and a threshold voltage of the driving transistor DT is sampled. Also, the second holding period may be a period where the data voltage Vdata is held by the specific node, and the emission period may be a period where the light emitting device EL emits light with a driving current generated based on the data voltage Vdata.

The nth subpixel SP according to the third embodiment of the present disclosure may have an initialization period INI, a first holding period HLD1, a sampling period SAM, and a second holding period HLD2 during a period where a gate-off voltage of the nth emission signal EM(n) is applied, and thus, compensation based on an internal circuit may be performed. An operation characteristic during the periods will be described below. For example, a gate-on voltage of a scan signal may be applied during two horizontal periods 2H, and a gate-off voltage of an emission signal may be applied during four horizontal periods 4H. Also, for example, each of the initialization period INI, the first holding period HLD1, the sampling period SAM, and the second holding period HLD2 may be executed during one horizontal period 1H. Driving of the pixel circuit will be described below with reference to the drawings.

Figure 15A:
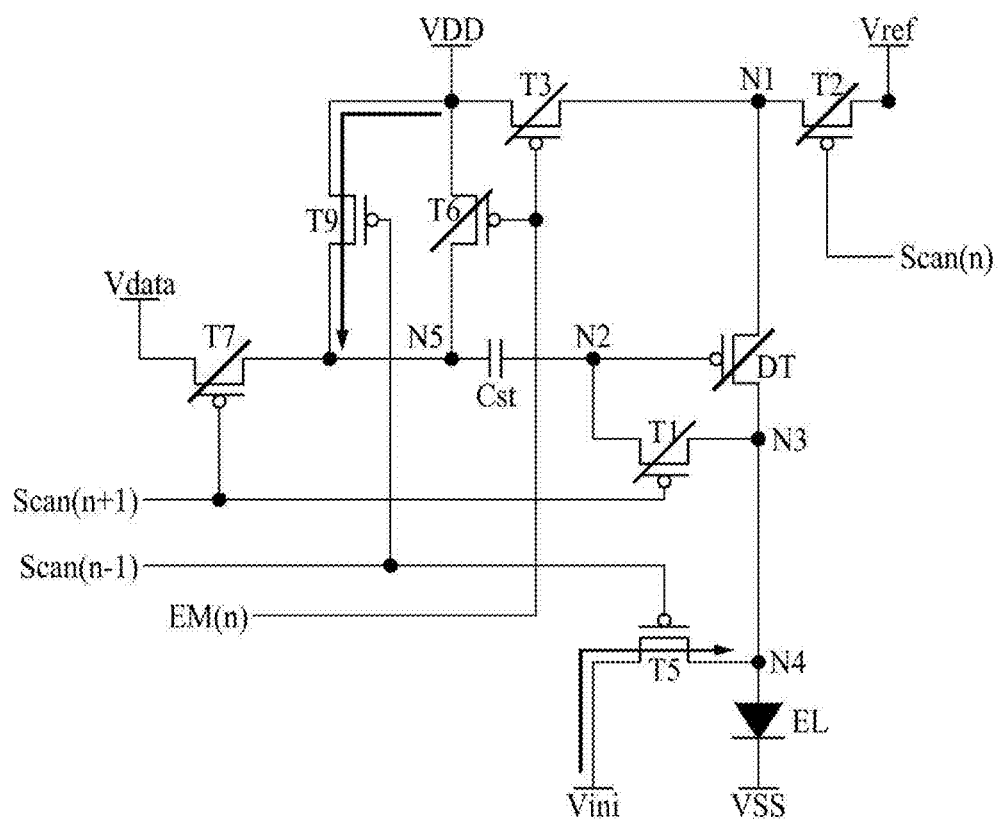
FIG. 15A is a diagram for describing driving of a subpixel according to a third embodiment of the present disclosure in an initialization period.
Figure 15B:
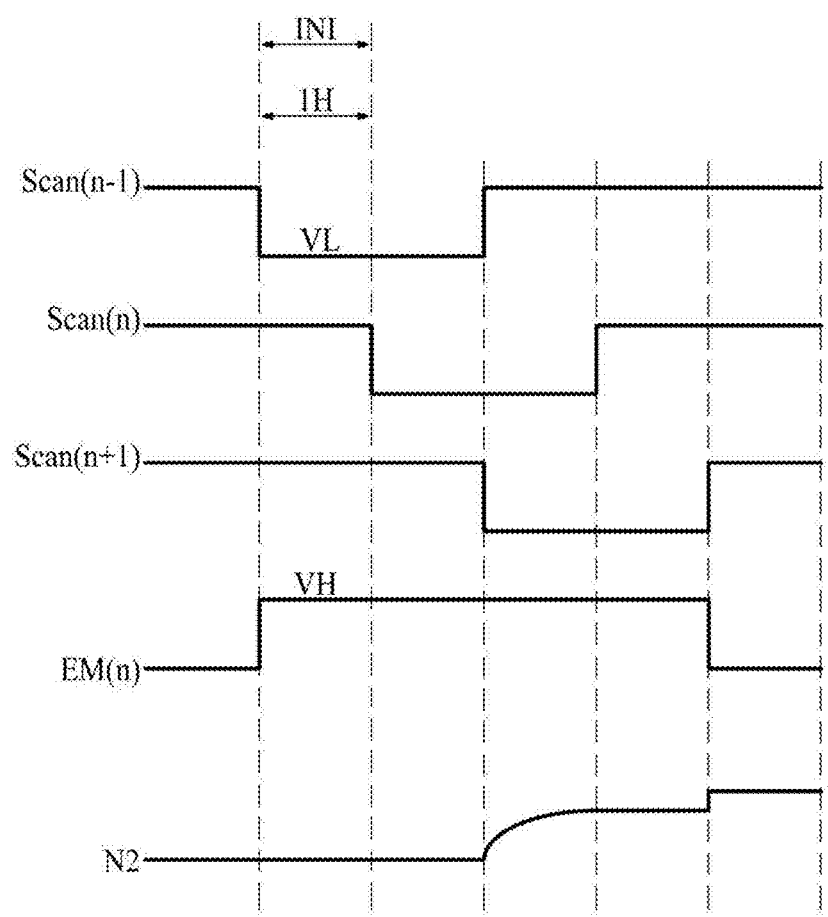
FIG. 15B is a waveform diagram for describing driving of the subpixel illustrated in FIG. 15A.

FIG. 15A is a diagram for describing driving of the subpixel according to the third embodiment of the present disclosure in the initialization period. FIG. 15B is a waveform diagram for describing driving of the subpixel illustrated in FIG. 15A.

In the initialization period INI, the n−1st scan signal Scan(n−1) may have a gate-on voltage, and the nth scan signal Scan(n), the n+1st scan signal Scan(n+1), and the nth emission signal EM(n) may each have a gate-off voltage. For example, the gate-on voltage may be a logic low voltage VL and may be −8V, and the gate-off voltage may be a logic high voltage VH and may be 8V.

The fifth transistor T5 and the ninth transistor T9 may be turned on by the gate-on voltage applied through the n−1st scan line. An initialization voltage Vini may be applied to the fourth node N4 through the turned-on fifth transistor T5, and thus, the anode of the light emitting device EL may be initialized to the initialization voltage Vini. In this case, the initialization voltage Vini may be a voltage which is equal to or lower than the low-level power voltage VSS. For example, the initialization voltage Vini may be a voltage of −4V to −3V, and the data voltage Vdata may be a voltage which varies within a range of 0.3V to 6.3V, based on luminance.

During the initialization period INI, the anode of the light emitting device EL may be initialized based on the initialization voltage Vini, and the high-level power voltage VDD may be applied to one electrode of the capacitor Cst.

Figure 16A:
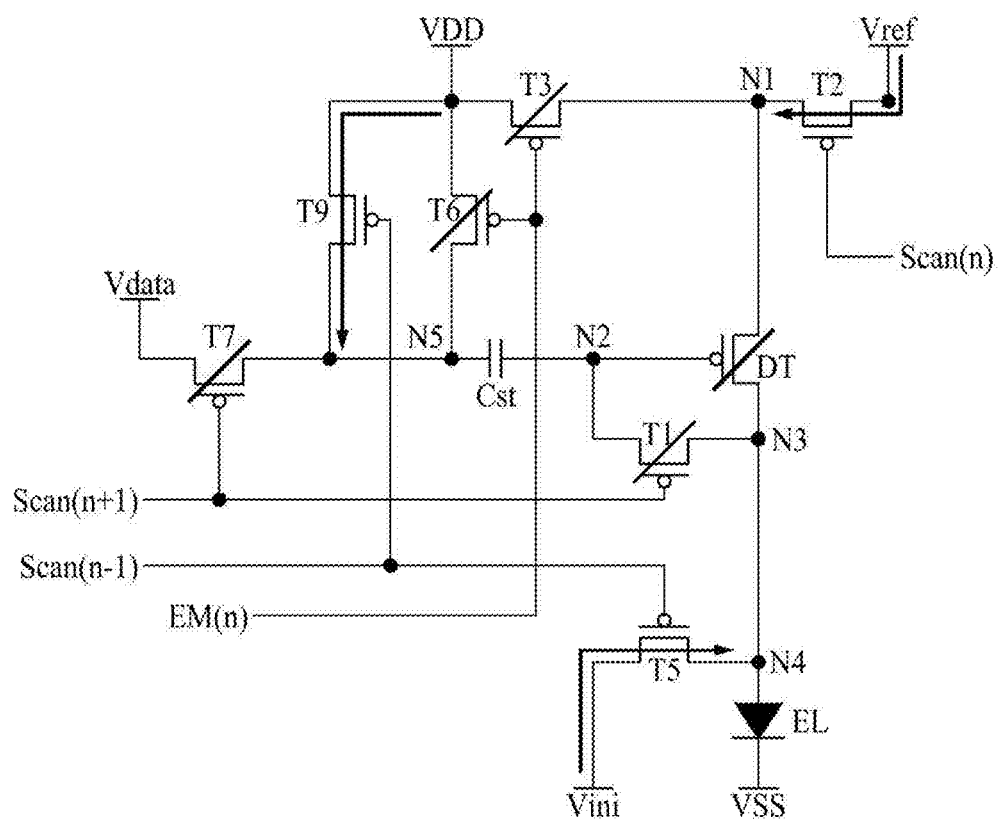
FIG. 16A is a diagram for describing driving of a subpixel according to a third embodiment of the present disclosure in a first holding period.
Figure 16B:
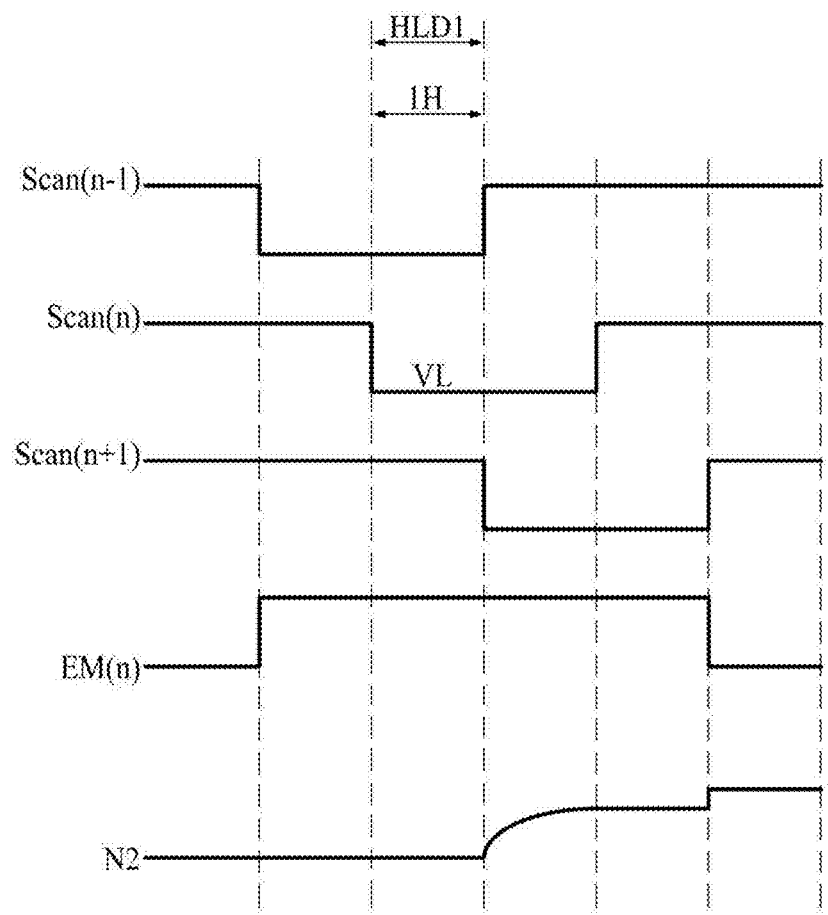
FIG. 16B is a waveform diagram for describing driving of the subpixel illustrated in FIG. 16A.

FIG. 16A is a diagram for describing driving of the subpixel according to the third embodiment of the present disclosure in the first holding period. FIG. 16B is a waveform diagram for describing driving of the subpixel illustrated in FIG. 16A.

In the first holding period HLD1, the n−1st scan signal Scan(n−1) and the nth scan signal Scan(n) may each have a gate-on voltage, and the n+1st scan signal Scan(n+1) and the nth emission signal EM(n) may each have a gate-off voltage. A period where the n−1st scan signal Scan(n−1) has the gate-on voltage and a period where the nth scan signal Scan(n) has the gate-on voltage may overlap each other in the first holding period HLD1.

The fifth transistor T5 and the ninth transistor T9 may maintain a turn-on state with the gate-on voltage applied through the n−1st scan line, and the second transistor T2 may be turned on by the gate-on voltage applied through the nth scan line. The initialization voltage Vini applied to the anode of the light emitting device EL through the turned-on fifth transistor T5 may be held, the high-level power voltage VDD applied to the fifth node N5 through the turned-on ninth transistor T9 may be held, and the reference voltage Vref may be applied to the first node N1 through the turned-on second transistor T2.

Figure 17A:
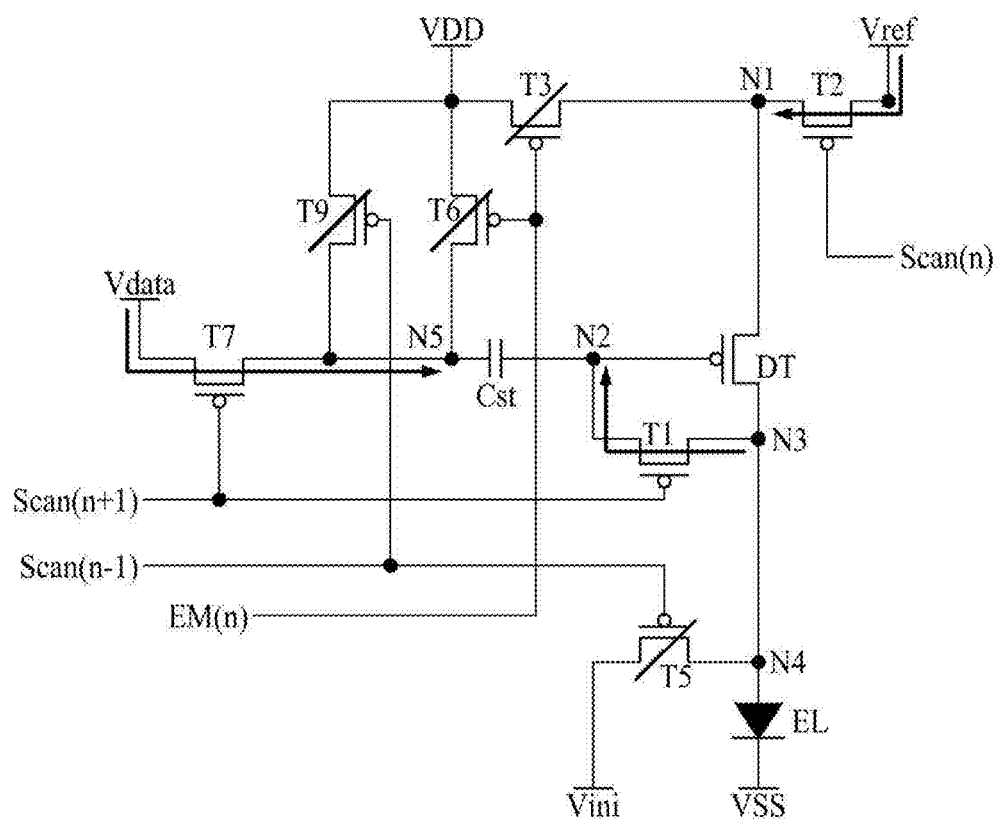
FIG. 17A is a diagram for describing driving of a subpixel according to a third embodiment of the present disclosure in a sampling period.
Figure 17B:
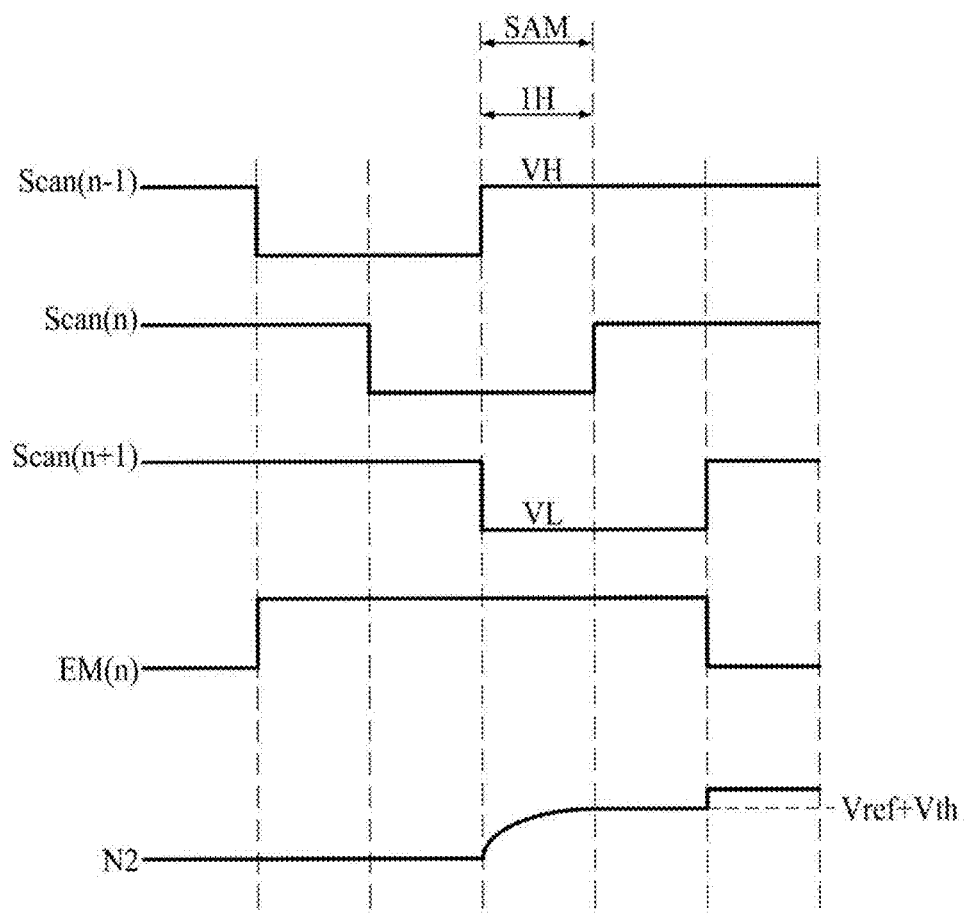
FIG. 17B is a waveform diagram for describing driving of the subpixel illustrated in FIG. 17A.

FIG. 17A is a diagram for describing driving of the subpixel according to the third embodiment of the present disclosure in the sampling period. FIG. 17B is a waveform diagram for describing driving of the subpixel illustrated in FIG. 17A.

In the sampling period SAM, the nth scan signal Scan(n) and the n+1st scan signal Scan(n+1) may each have a gate-on voltage, and the n−1st scan signal Scan(n−1) and the nth emission signal EM(n) may each have a gate-off voltage.

The second transistor T2 may maintain a turn-on state with the gate-on voltage applied through the nth scan line, and the first transistor T1 may be turned on by the gate-on voltage applied through the n+1st scan line, whereby the driving transistor DT may be in the diode connection state. The reference voltage Vref applied through the turned-on second transistor T2 may be held by the source of the driving transistor DT, and the gate and the drain of the driving transistor DT may be connected to each other by the turned-on first transistor T1, whereby the driving transistor DT may be turned on. A voltage of the second node N2 connected to the gate of the driving transistor DT may increase up to a sum of the reference voltage Vref and a threshold voltage Vth of the driving transistor DT. Also, the data voltage Vdata may be applied to the fifth node N5 by the seventh transistor T7 which is turned on by the gate-on voltage applied through the n+1st scan line. Therefore, a voltage corresponding to the sum of the reference voltage Vref and the threshold voltage Vth of the driving transistor DT may be applied to the first electrode of the capacitor Cst, and the data voltage Vdata may be applied to the second electrode of the capacitor Cst, whereby the capacitor Cst may be charged with a difference voltage "Vdata-(Vref+Vth)" between the voltage applied to the first electrode and the data voltage applied to the second electrode. In this case, the reference voltage Vref may be a voltage which is higher than the low-level power voltage VSS and is lower than the high-level power voltage VDD. For example, the reference voltage Vref may be 4V, and the threshold voltage Vth may be −4V. However, the present embodiment is not limited thereto.

During the sampling period SAM, since the nth scan signal Scan(n) and the n+1st scan signal Scan(n+1) having the gate-on voltage are applied, one electrode of the capacitor Cst may be held by applying the data voltage Vdata to the fifth node N5, and by applying the reference voltage Vref to the source of the driving transistor DT, the second node N2 may sample the threshold voltage Vth of the driving transistor DT and may sense the reference voltage Vref.

Figure 18A:
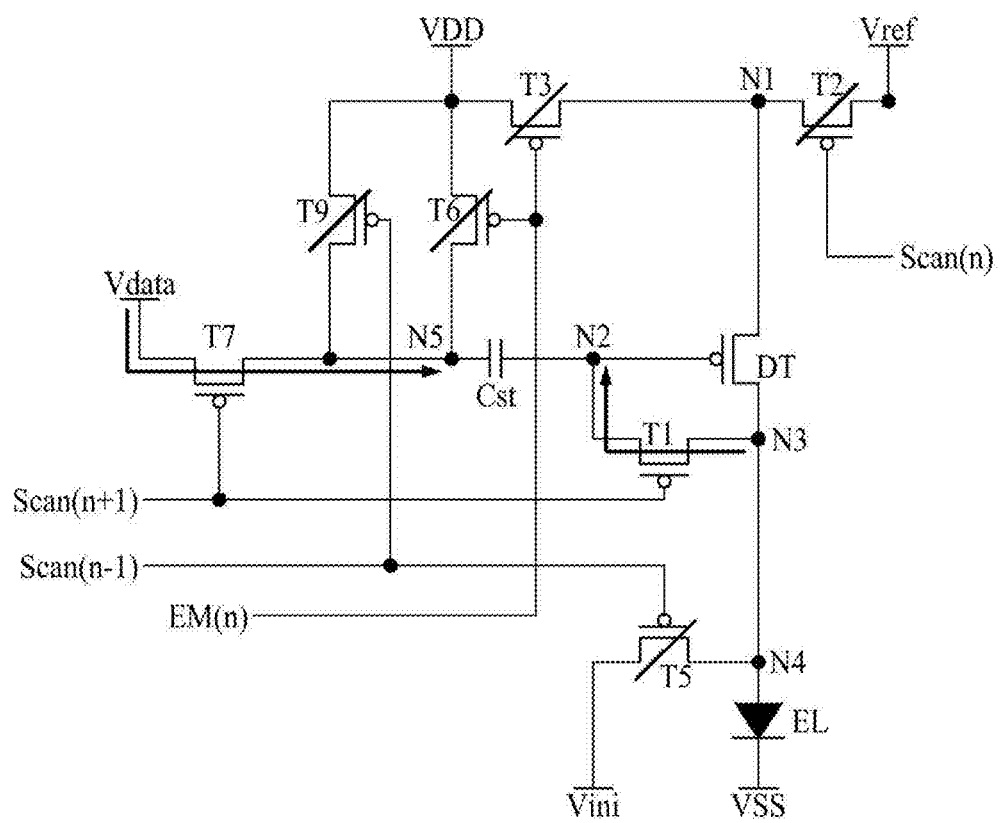
FIG. 18A is a diagram for describing driving of a subpixel according to a third embodiment of the present disclosure in a second holding period.
Figure 18B:
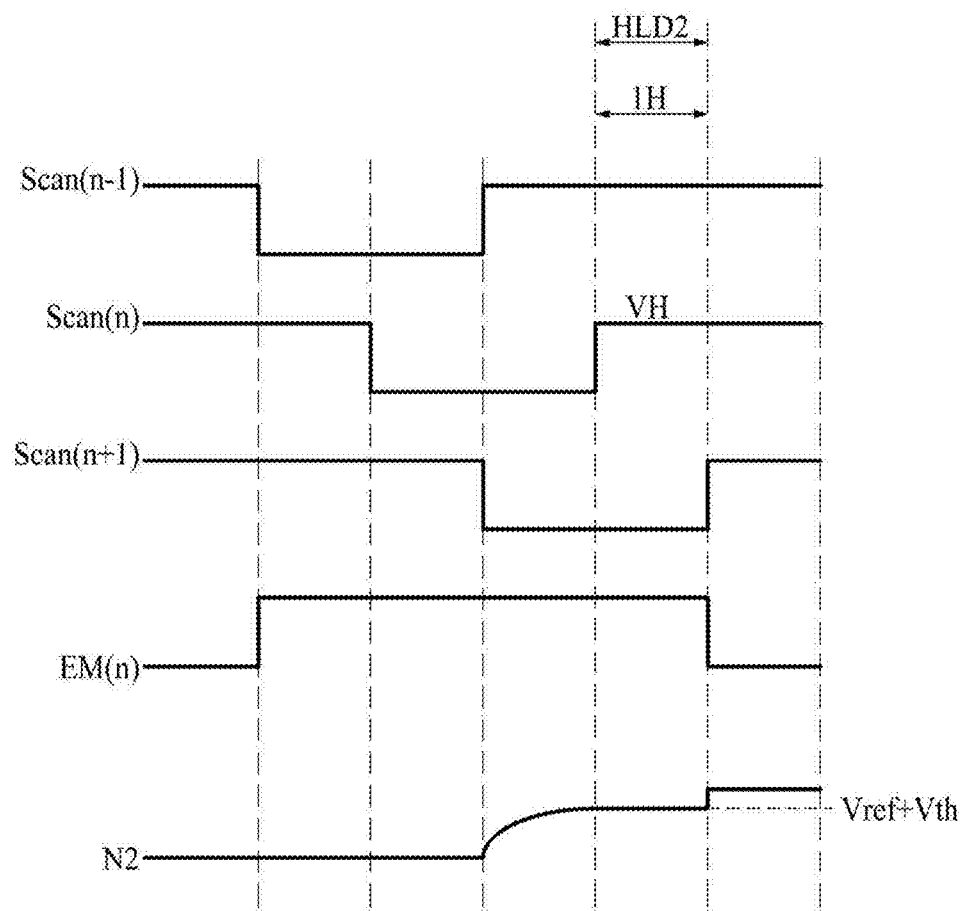
FIG. 18B is a waveform diagram for describing driving of the subpixel illustrated in FIG. 18A.

FIG. 18A is a diagram for describing driving of the subpixel according to the third embodiment of the present disclosure in the second holding period. FIG. 18B is a waveform diagram for describing driving of the subpixel illustrated in FIG. 18A.

In the second holding period HLD2, the n+1st scan signal Scan(n+1) may hold a gate-on voltage, and the n−1st scan signal Scan(n−1), the nth scan signal Scan(n), and the nth emission signal EM(n) may each have a gate-off voltage.

The first transistor T1 and the seventh transistor T7 may maintain a turn-on state with the gate-on voltage applied through the n+1st scan signal Scan(n+1). In the second holding period HLD2, the capacitor Cst may be charged with the data voltage Vdata and may hold the data voltage Vdata, based on a voltage difference between both ends thereof.

Figure 19A:
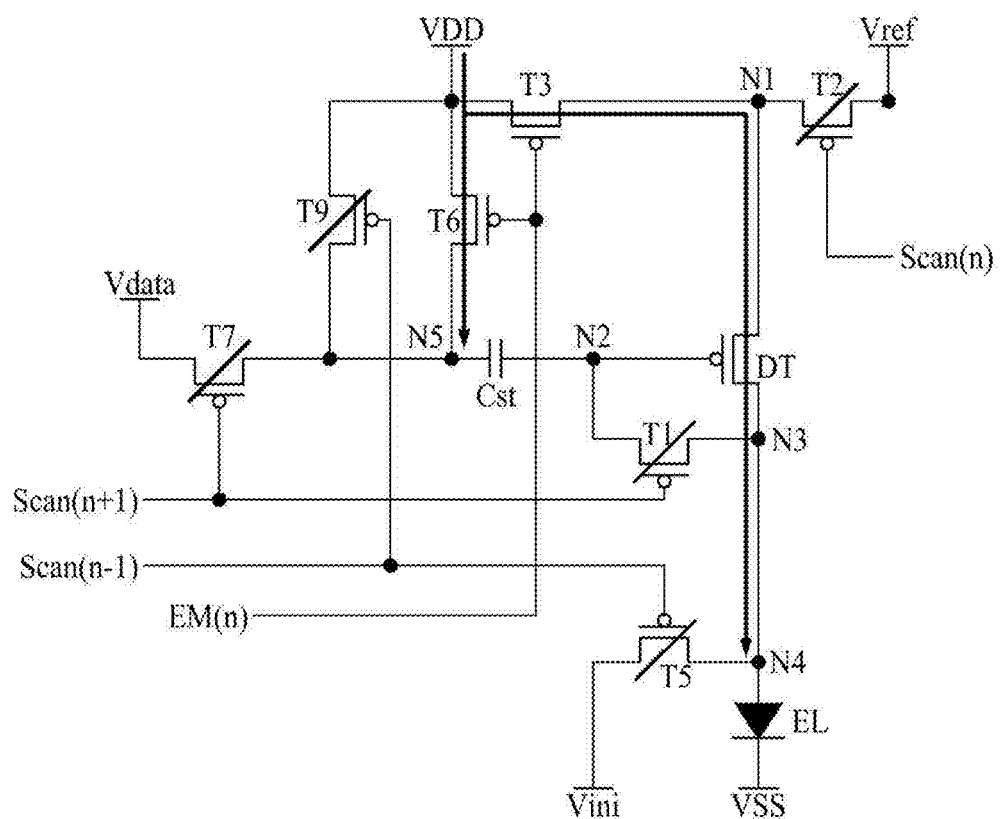
FIG. 19A is a diagram for describing driving of a subpixel according to a third embodiment of the present disclosure in an emission period.
Figure 19B:
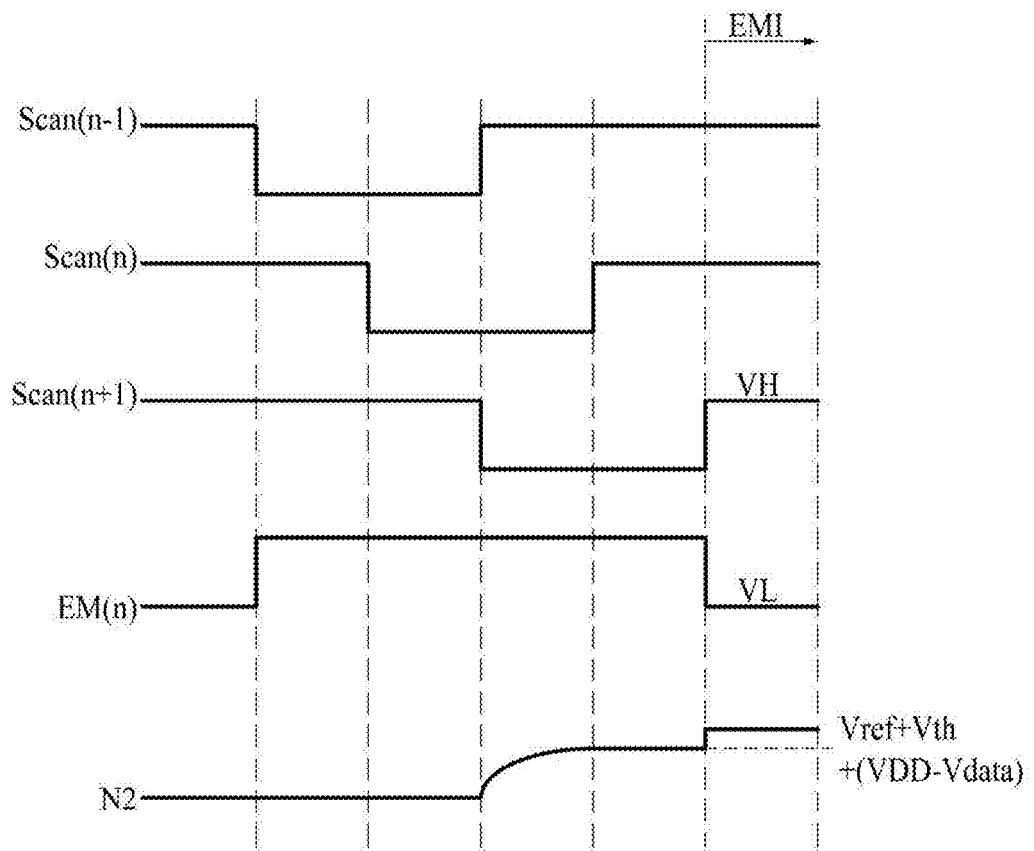
FIG. 19B is a waveform diagram for describing driving of the subpixel illustrated in FIG. 19A.

FIG. 19A is a diagram for describing driving of the subpixel according to the third embodiment of the present disclosure in the emission period. FIG. 19B is a waveform diagram for describing driving of the subpixel illustrated in FIG. 19A.

In the emission period EMI, the nth emission signal EM(n) may have a gate-on voltage, and the n−1st scan signal Scan(n−1), the nth scan signal Scan(n), and the n+1st scan signal Scan(n+1) may each have a gate-off voltage The third transistor T3 and the sixth transistor T6 may be turned on by the gate-on voltage of the nth emission signal EM(n) applied thereto. The high-level power voltage VDD may be applied to the first node N1 through the turned-on third transistor T3, and the high-level power voltage VDD may be applied to the fifth node N5 through the turned-on sixth transistor T6. A voltage of the fifth node N5 connected to the second electrode of the capacitor Cst may be shifted from the data voltage Vdata to the high-level power voltage VDD, and due to coupling of the capacitor Cst, a voltage at the first electrode of the capacitor Cst may vary by a voltage variation of the fifth node N5. Therefore, a voltage of the second node N2 connected to the first electrode of the capacitor Cst may become "Vref+Vth+(VDD-Vdata)". In this case, since the high-level power voltage VDD is applied to the source of the driving transistor DT, the driving transistor DT may be turned on to apply a driving current to the anode of the light emitting device EL. Therefore, the light emitting device EL may emit light. For example, the high-level power voltage VDD may be 4.6V.

In the nth subpixel SP according to the third embodiment of the present disclosure, the high-level power voltage VDD may be applied to each of the source and the gate of the driving transistor DT, in order to consider the voltage drop of the high-level power voltage VDD. Therefore, a current of the nth subpixel SP which has been compensated for may be expressed as the following Equation:

$$Ioled = K(Vgs-Vth)^2 = K\{(Vref+Vth+(VDD-Vdata))-VDD-Vth\}^2 = K(Vref-Vdata)^2$$

where Ioled denotes a current flowing through the light emitting device EL, K denotes a constant, Vgs denotes a voltage between the gate and the source of the driving transistor DT, Vth denotes the threshold voltage of the driving transistor DT, VDD denotes the high-level power voltage applied through the high level power line VDDL, Vref denotes the reference voltage applied through the reference voltage line VrefL, and Vdata denotes a data voltage applied through the data line DL.

As seen in the Equation, Ioled may be determined based on a difference between the reference voltage and the data voltage. According to the Equation, in the nth subpixel SP according to the third embodiment of the present disclosure, it can be seen that the voltage drop of the high-level power voltage is compensated for, based on the high-level power voltage VDD which is applied to the gate and the source of the driving transistor DT in the emission period EMI and the reference voltage Vref which is applied to the source of the driving transistor DT in the sampling period SAM.

Therefore, a driving circuit for compensating for a sequential shift characteristic based on the voltage drop of the high-level power voltage may be implemented, and thus, an image quality issue such as the vertical luminance non-uniformity or crosstalk of a display device is solved.

Moreover, the second and third transistors T2 and T3 of the plurality of transistors configuring the nth subpixel SP according to the third embodiment of the present disclosure may be disposed on one side of the non-display area and may be used in common by q number of subpixels disposed on an nth pixel line. Also, in a case where the gate driver 130 is disposed on each of the left and the right, the second and third transistors T2 and T3 may be disposed in each of a left non-display area and a right non-display area and may be used in common by q/2 number of subpixels. Therefore, the number of transistors configuring each subpixel is reduced, and thus, each subpixel is efficiently designed, thereby implementing a high-resolution display device. In this case, the other transistors (which are driving transistor DT, first transistor T1, the fifth transistor T5, sixth transistor T6, seventh transistor T7, the ninth transistor T9) except for the second and third transistors T2 and T3 among the plurality of transistors, the light emitting device EL and the capacitor Cst configuring the nth subpixel SP may be necessary for an individual operation of each subpixel SP are disposed in the display area, and thus, cannot be used in common by the nth pixel line. Accordingly, since the second and third transistors T2 and T3 are disposed in the non-display area, the high-resolution display device may be implemented.

Figure 20:
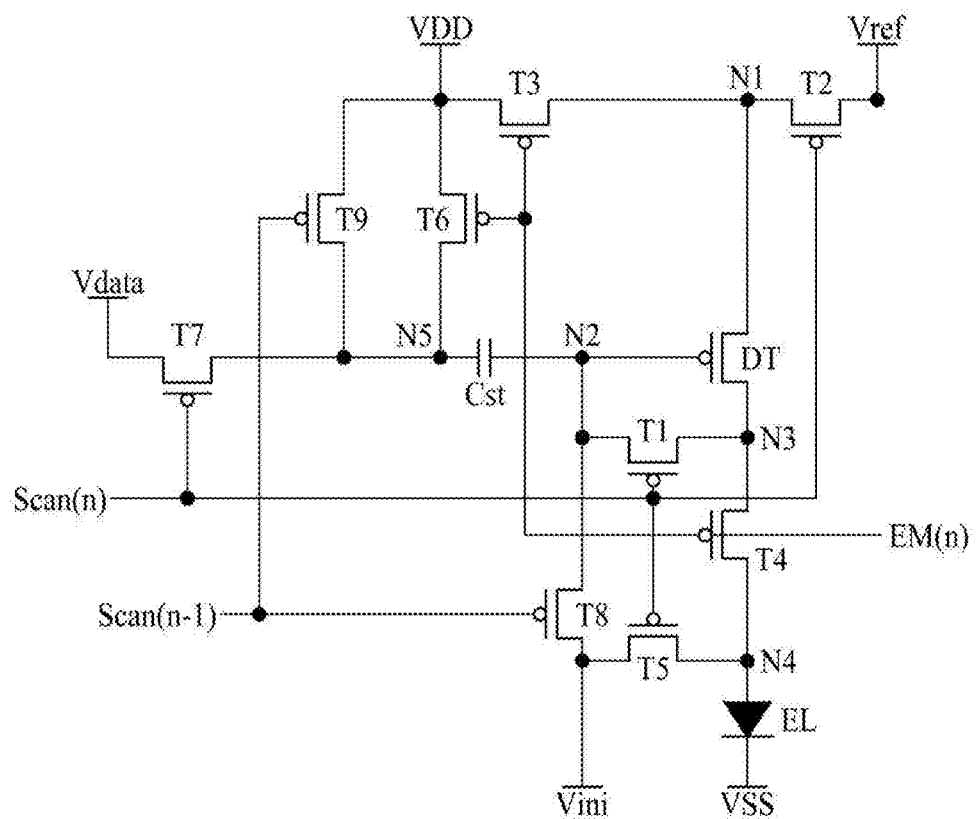
FIG. 20 is a circuit diagram of a subpixel according to a fourth embodiment of the present disclosure.

FIG. 20 is a circuit diagram of a subpixel according to a fourth embodiment of the present disclosure. FIG. 20 is a modification example where two transistors are added to the pixel circuit of FIG. 3, and thus, overlapping descriptions are omitted or will be briefly described.

An nth subpixel SP according to a fourth embodiment of the present disclosure may include first to ninth transistors T1 to T9, a driving transistor DT, a capacitor Cst, and a light emitting device EL. In the third embodiment of the present disclosure, the nth subpixel SP may be implemented based on a total of ten transistors and one capacitor.

The driving transistor DT may include a source connected to a first node N1, a gate connected to a second node N2, and a drain connected to a third node N3. When a gate-on voltage is applied to the second node N2, the driving transistor DT may be turned on to provide a constant current to the third node N3.

The first transistor T1 may include a gate connected to an nth scan line, a source connected to the second node N2, and a drain connected to the third node N3. The first transistor T1 may be turned on in response to a gate-on voltage of an nth scan signal Scan(n) applied through the nth scan line. When the first transistor T1 is turned on, the gate and the drain of the driving transistor DT may be electrically connected to each other, and thus, the driving transistor DT may be in a diode connection state.

The second transistor T2 may include a gate connected to the nth scan line, a source connected to a reference voltage line, and a drain connected to the first node N1. The second transistor T2 may be turned on in response to a gate-on voltage of an nth scan signal Scan(n) applied through the nth scan line. When the second transistor T2 is turned on, a reference voltage Vref may be applied to the first node N1.

The third transistor T3 may include a gate connected to an nth emission line, a source connected to a high level power line, and a drain connected to the first node N1. The third transistor T3 may be turned on in response to a gate-on voltage of an nth emission signal EM(n) applied through the nth emission line. When the third transistor T3 is turned on, a high-level power voltage VDD may be applied to the first node N1.

The fourth transistor T4 may include a gate connected to an nth emission line, a source connected to the third node N3, and a drain connected to a fourth node N4. In this case, the fourth node N4 may be connected to an anode of the light emitting device EL. The fourth transistor T4 may be turned on in response to a gate-on voltage of the nth emission signal EM(n) applied through the nth emission line. When the fourth transistor T4 is turned on, a current may flow between the third node N3 and the fourth node N4.

The fifth transistor T5 may include a gate connected to the nth scan line, a source connected to the fourth node N4, and a drain connected to an initialization line. The fifth transistor T5 may be turned on in response to the gate-on voltage of the nth scan signal Scan(n) applied through the nth scan line. When the fifth transistor T5 is turned on, an initialization voltage Vini may be applied to the fourth node N4, and thus, the anode of the light emitting device EL may be initialized.

The sixth transistor T6 may include a gate connected to the nth emission line, a source connected to the high level power line, and a drain connected to a fifth node N5. The sixth transistor T6 may be turned on in response to the gate-on voltage of the nth emission signal EM(n) applied through the nth emission line.

The ninth transistor T9 may include a gate connected to the n−1st scan line, a source connected to the high level power line, and a drain connected to the fifth node N5. The ninth transistor T9 may be turned on in response to the gate-on voltage of the n−1st scan signal Scan(n−1) applied through the n−1st scan line. When the ninth transistor T9 is turned on, a high-level power voltage VDD may be applied to the fifth node N5.

The capacitor Cst may include a first electrode connected to the second node N2 and a second electrode connected to the fifth node N5.

The seventh transistor T7 may include a gate connected to the nth scan line, a source connected to a data line, and a drain connected to the fifth node N5. The seventh transistor T7 may be turned on in response to the gate-on voltage of the nth scan signal Scan(n) applied through the nth scan line. When the seventh transistor T7 is turned on, a data voltage Vdata may be applied to the fifth node N5.

The eighth transistor T8 may include a gate connected to an n−1st scan line, a source connected to the second node N2, and a drain connected to an initialization line. The eighth transistor T8 may be turned on in response to the gate-on voltage of an n−1st scan signal Scan(n−1) applied through the n−1st scan line. When the eighth transistor T8 is turned on, an initialization voltage Vini may be applied to the second node N2.

The light emitting device EL may include the anode connected to the fourth node N4 and a cathode to which a low-level power voltage VSS is applied. When the fourth transistor T4 is turned on, a driving current generated through the driving transistor DT may be applied to the anode of the light emitting device EL, and thus, the light emitting device EL may emit light. For example, the low-level power voltage VSS may be a voltage of −4V to −2.5V, but is not limited thereto.

Moreover, a voltage applied to the gate of the driving transistor DT may control a turn-on state of the driving transistor DT, and thus, a transistor including a source or a drain connected to the gate of the driving transistor DT may include two or more transistors serially connected to each other, for maximally suppressing an influence of a leakage current. In this case, the two or more transistors may be controlled by the same control signal. Accordingly, in the nth subpixel SP according to the fourth embodiment of the present disclosure, the first transistor T1 and the eighth transistor T8 may each be implemented as a double-gate type transistor.

The nth subpixel SP according to the fourth embodiment of the present disclosure may operate in the order of an initialization period, a sampling period, a holding period, and an emission period. The initialization period may be a period where the gate of the driving transistor DT is initialized, the sampling period may be a period where a threshold voltage of the driving transistor DT is sampled and a data voltage Vdata is applied through a data line, and the holding period may be a period where undesired emission of light caused by a delay of the scan signal is prevented. Also, the emission period may be a period where the light emitting device EL emits light with a driving current generated based on the data voltage Vdata.

The nth subpixel SP according to the fourth embodiment of the present disclosure may have an initialization period INI and a sampling period SAM during a period where a gate-off voltage of the nth emission signal EM(n) is applied, and thus, compensation based on an internal circuit may be performed. An operation characteristic during the periods will be described below. For example, a gate-on voltage of the scan signal may be applied during one horizontal periods 1H, and a gate-off voltage of an emission signal may be applied during three horizontal periods 3H. Also, for example, each of the initialization period INI, the sampling period SAM, and the holding period HLD may be executed during one horizontal period 1H. Driving of the pixel circuit will be described below with reference to the drawings.

Figure 21A:
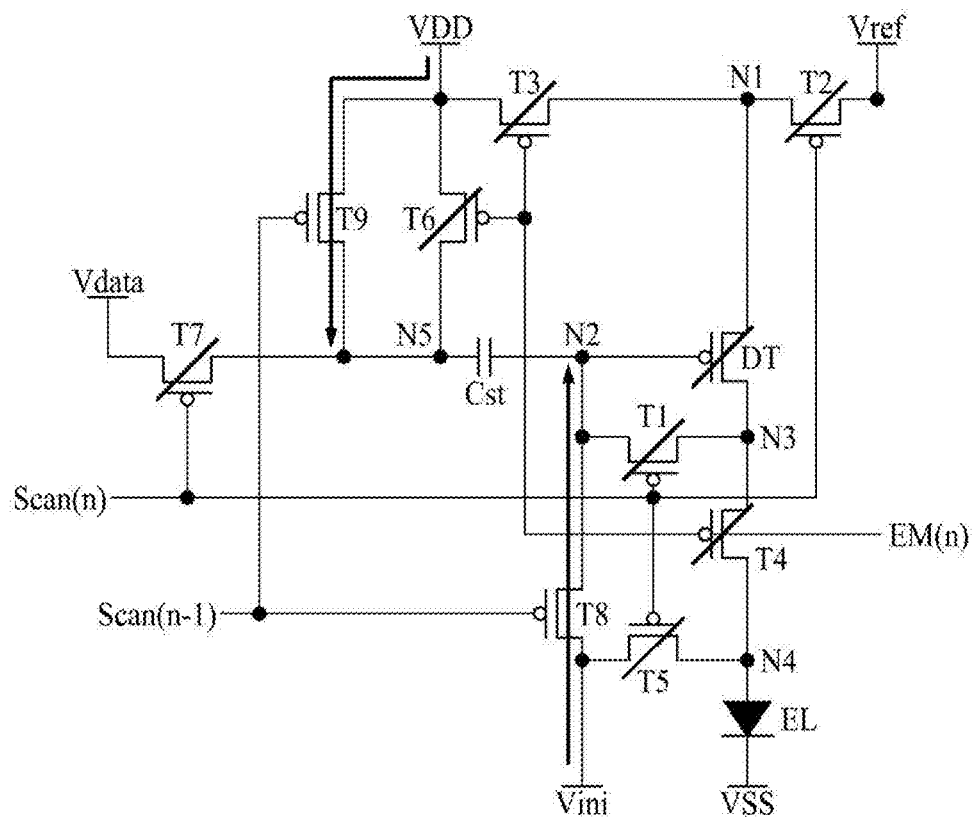
FIG. 21A is a diagram for describing driving of a subpixel according to a fourth embodiment of the present disclosure in an initialization period.
Figure 21B:
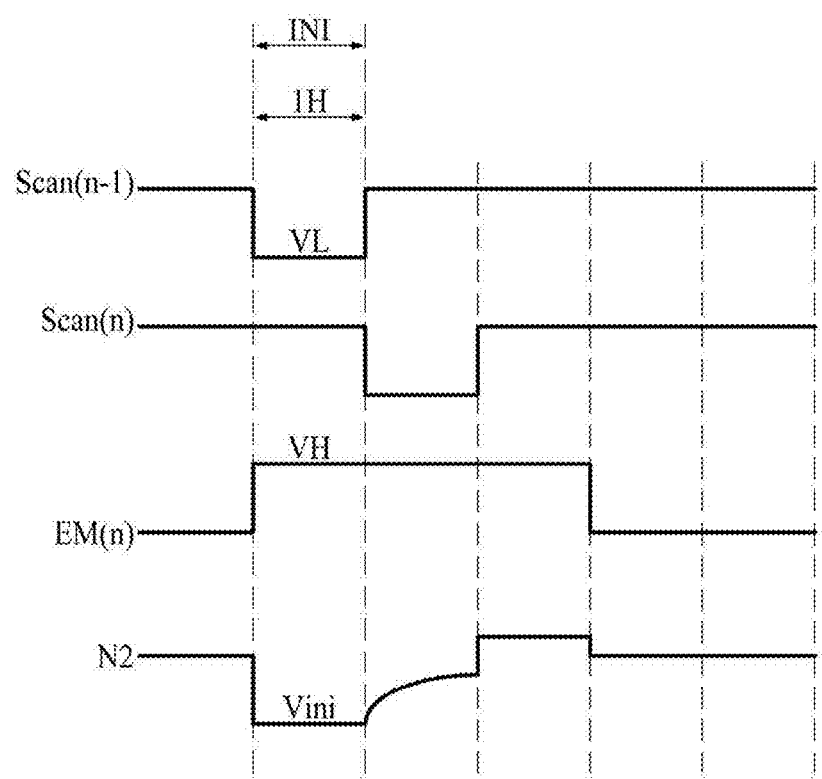
FIG. 21B is a waveform diagram for describing driving of the subpixel illustrated in FIG. 21A.

FIG. 21A is a diagram for describing driving of the subpixel according to the fourth embodiment of the present disclosure in the initialization period. FIG. 21B is a waveform diagram for describing driving of the subpixel illustrated in FIG. 21A.

In the initialization period INI, the n−1st scan signal Scan(n−1) may have a gate-on voltage, and the nth scan signal Scan(n) and the nth emission signal EM(n) may each have a gate-off voltage. For example, the gate-on voltage may be a logic low voltage VL and may be −8V, and the gate-off voltage may be a logic high voltage VH and may be 8V. However, the present embodiment is not limited thereto.

The ninth transistor T9 and the eighth transistor T8 may be turned on by the gate-on voltage applied through the n−1st scan line. The high-level power voltage VDD may be applied to the fifth node N5 through the turned-on ninth transistor T9, and an initialization voltage Vini may be applied to the second node N2 through the turned-on eighth transistor T8, whereby the gate of the driving transistor DT may be initialized to the initialization voltage Vini. In this case, the initialization voltage Vini may be a voltage which is equal to or lower than the low-level power voltage VSS. For example, the initialization voltage Vini may be a voltage of −4V to −3V, and the data voltage Vdata may be a voltage which varies within a range of 0.3V to 6.3V, based on luminance.

During the initialization period INI, the gate of the driving transistor DT may be initialized based on the initialization voltage Vini.

Figure 22A:
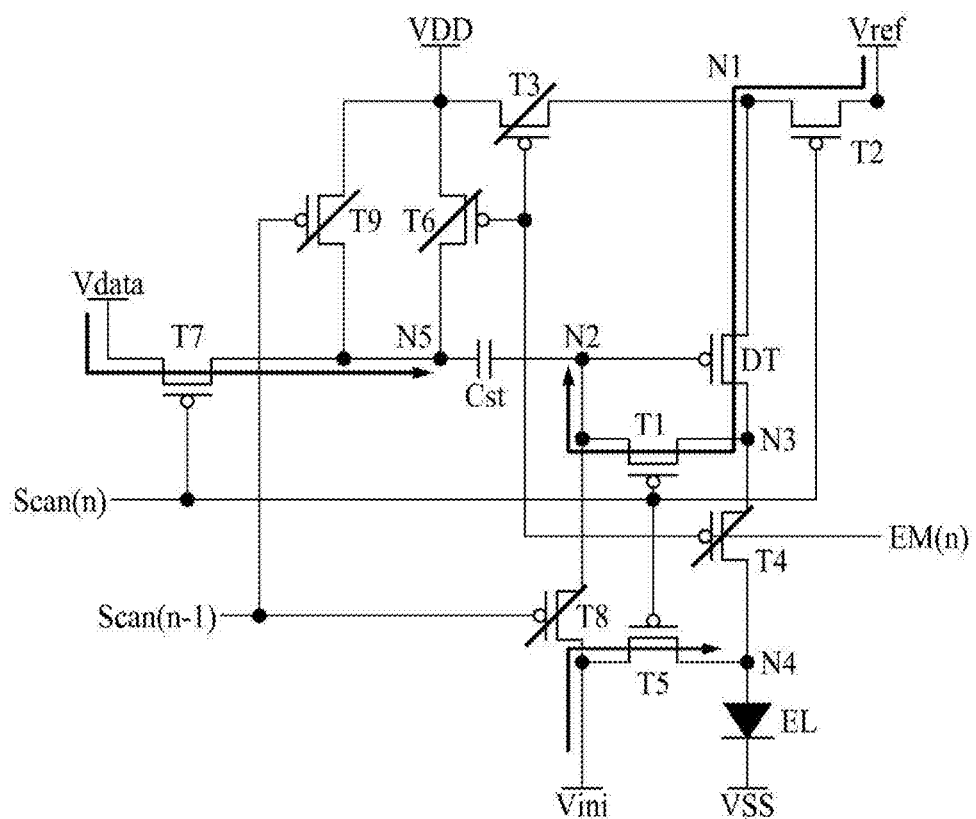
FIG. 22A is a diagram for describing driving of a subpixel according to a fourth embodiment of the present disclosure in a sampling period.
Figure 22B:
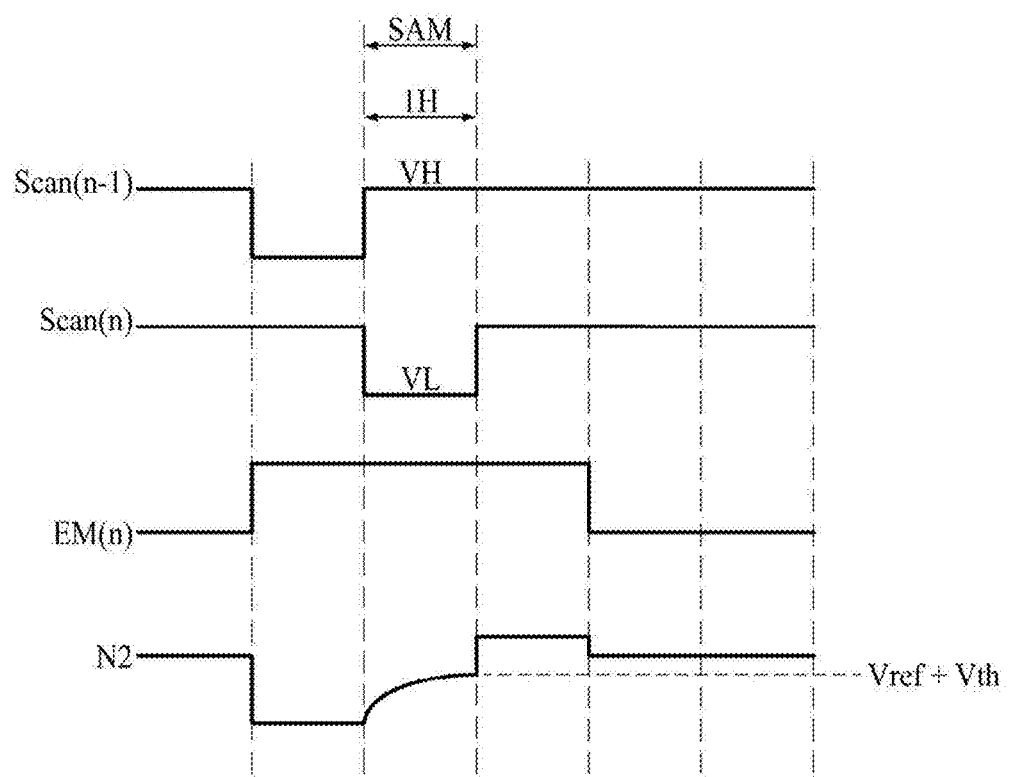
FIG. 22B is a waveform diagram for describing driving of the subpixel illustrated in FIG. 22A.

FIG. 22A is a diagram for describing driving of the subpixel according to the fourth embodiment of the present disclosure in the sampling period. FIG. 22B is a waveform diagram for describing driving of the subpixel illustrated in FIG. 22A.

In the sampling period SAM, the nth scan signal Scan(n) may have a gate-on voltage, and the n−1st scan signal Scan(n−1) and the nth emission signal EM(n) may each have a gate-off voltage.

The first transistor T1, the second transistor T2, the fifth transistor T5, and the seventh transistor T7 may be turned on by the gate-on voltage applied through the nth scan line. The reference voltage Vref may be applied to the source of the driving transistor DT through the turned-on second transistor T2, and the gate and the drain of the driving transistor DT may be connected to each other by the turned-on first transistor T1, whereby the driving transistor DT may be turned on and may be in the diode connection state. A voltage of the second node N2 connected to the gate of the driving transistor DT may increase up to a sum of the reference voltage Vref and a threshold voltage Vth of the driving transistor DT. Also, the data voltage Vdata may be applied to the fifth node N5 through the turned-on seventh transistor T7. Therefore, a voltage corresponding to the sum of the reference voltage Vref and the threshold voltage Vth of the driving transistor DT may be applied to the first electrode of the capacitor Cst, and the data voltage Vdata may be applied to the second electrode of the capacitor Cst, whereby the capacitor Cst may be charged with a difference voltage "Vdata-(Vref+Vth)" between the voltage applied to the first electrode and the data voltage applied to the second electrode. Also, the fifth transistor T5 may be turned on to initialize the anode of the light emitting device EL to the initialization voltage Vini. For example, the reference voltage Vref may be 4V, and the threshold voltage Vth may be −4V. However, the present embodiment is not limited thereto.

During the sampling period SAM, since the nth scan signal Scan(n) having the gate-on voltage is applied, one electrode of the capacitor Cst may be held by applying the data voltage Vdata to the fifth node N5, and by applying the reference voltage Vref to the source of the driving transistor DT, the second node N2 may sample the threshold voltage Vth of the driving transistor DT and may sense the reference voltage Vref.

Figure 23A:
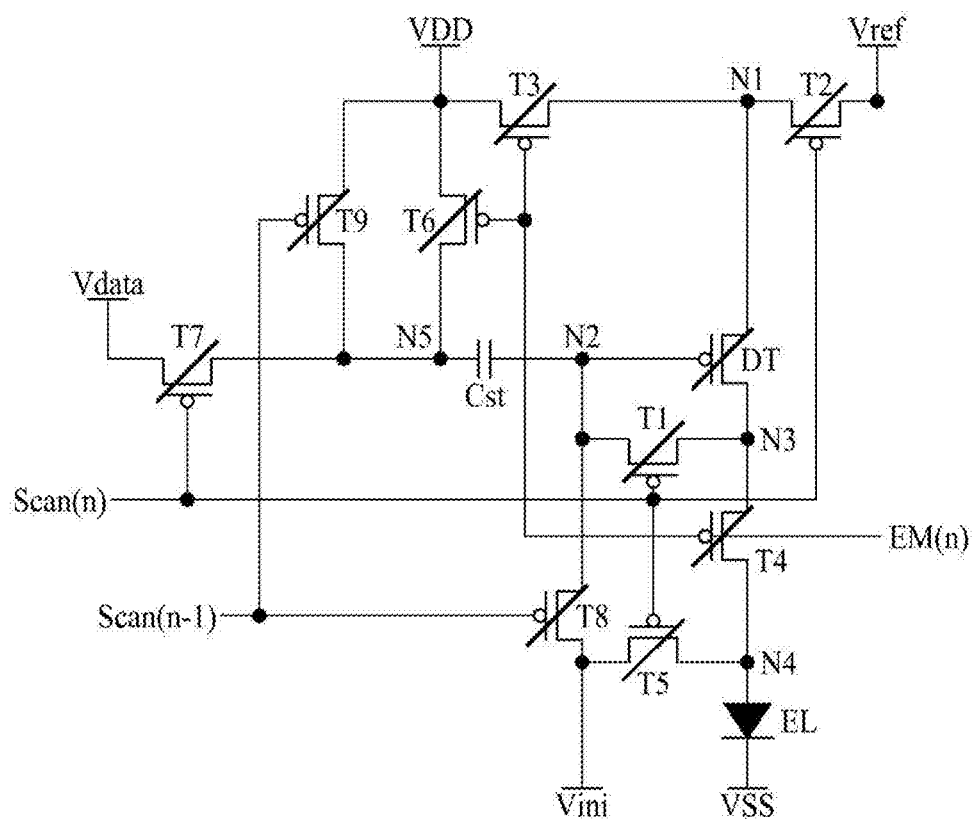
FIG. 23A is a diagram for describing driving of a subpixel according to a fourth embodiment of the present disclosure in a holding period.
Figure 23B:
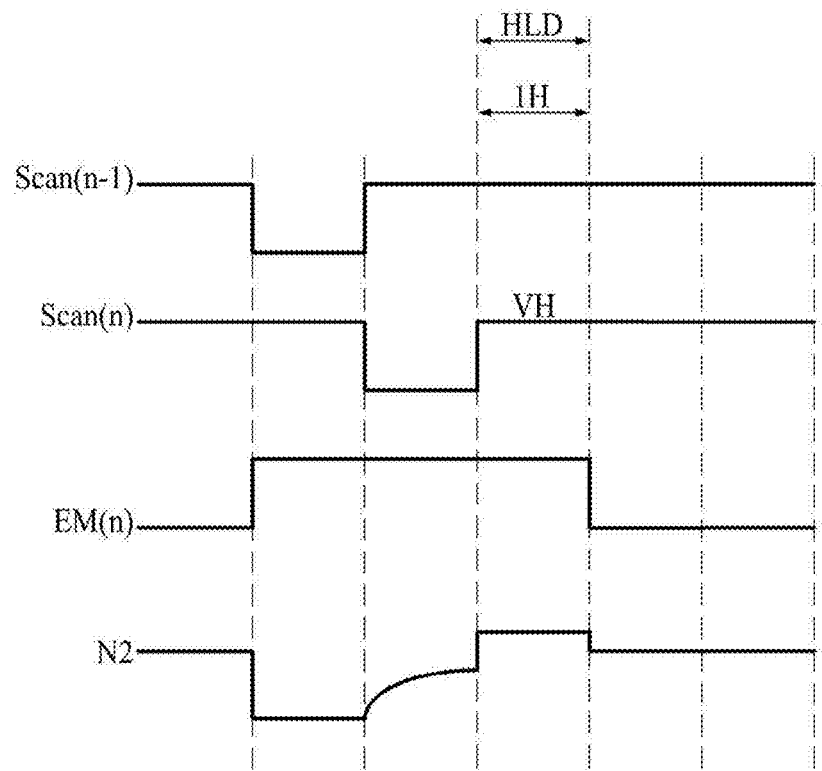
FIG. 23B is a waveform diagram for describing driving of the subpixel illustrated in FIG. 23A.

FIG. 23A is a diagram for describing driving of the subpixel according to the fourth embodiment of the present disclosure in the holding period. FIG. 23B is a waveform diagram for describing driving of the subpixel illustrated in FIG. 23A.

In the holding period HLD, the n−1st scan signal Scan (n−1), the nth scan signal Scan(n), and the nth emission signal EM(n) may each have a gate-on voltage, and thus, the first to ninth transistors T1 to T9 may be turned off.

In the holding period HLD, the nth scan signal Scan(n) may be shifted from the gate-on voltage to the gate-off voltage, and thus, a voltage at the gate of the driving transistor DT may slightly vary due to a parasitic capacitor of the first transistor T1. In this case, the driving transistor DT may be in a turn-off state.

For example, if the nth emission signal EM(n) is shifted to the gate-on voltage at a time when the nth scan signal Scan(n) is shifted from the gate-on voltage to the gate-off voltage, a sampling error occurs. The reason is because, as illustrated in the drawing, the nth scan signal Scan(n) is not ideally shifted from a logic low voltage to a logic high voltage, and a time when the logic low voltage is shifted to the logic high voltage is delayed due to RC delay. In this case, if the nth emission signal EM(n) is shifted to the gate-on voltage, undesired emission of light occurs. Accordingly, the subpixel according to the fourth embodiment of the present disclosure may include the holding period HLD, thereby preventing undesired emission of light caused by a delay of a scan signal.

Figure 24A:
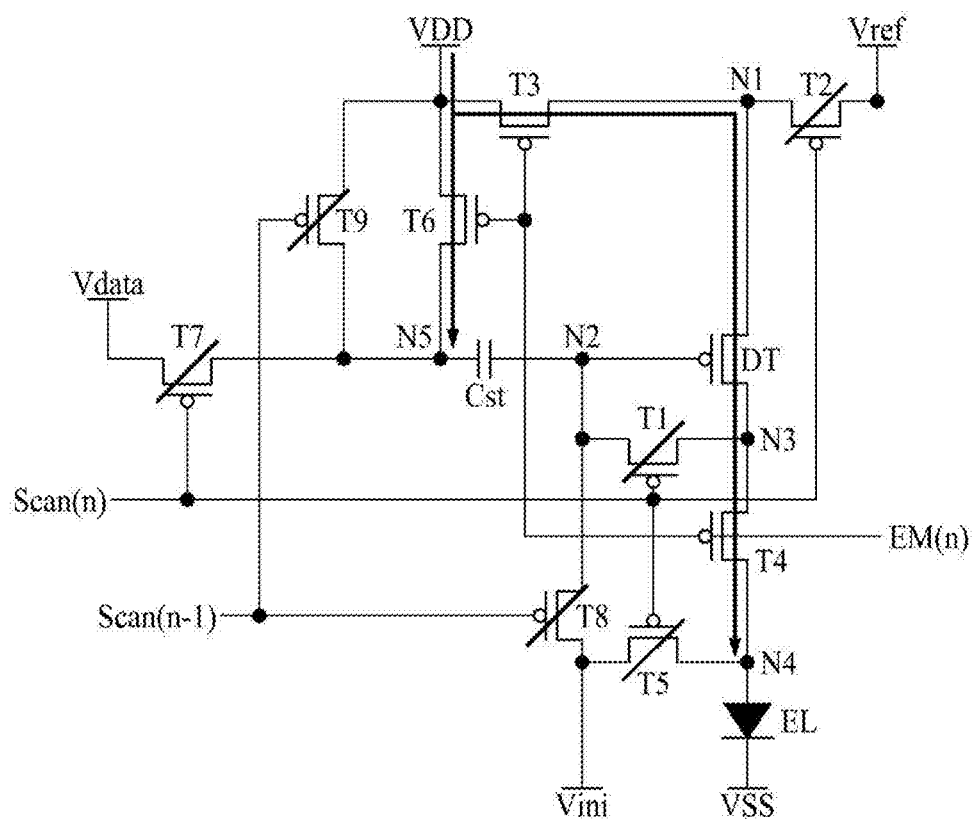
FIG. 24A is a diagram for describing driving of a subpixel according to a fourth embodiment of the present disclosure in an emission period.
Figure 24B:
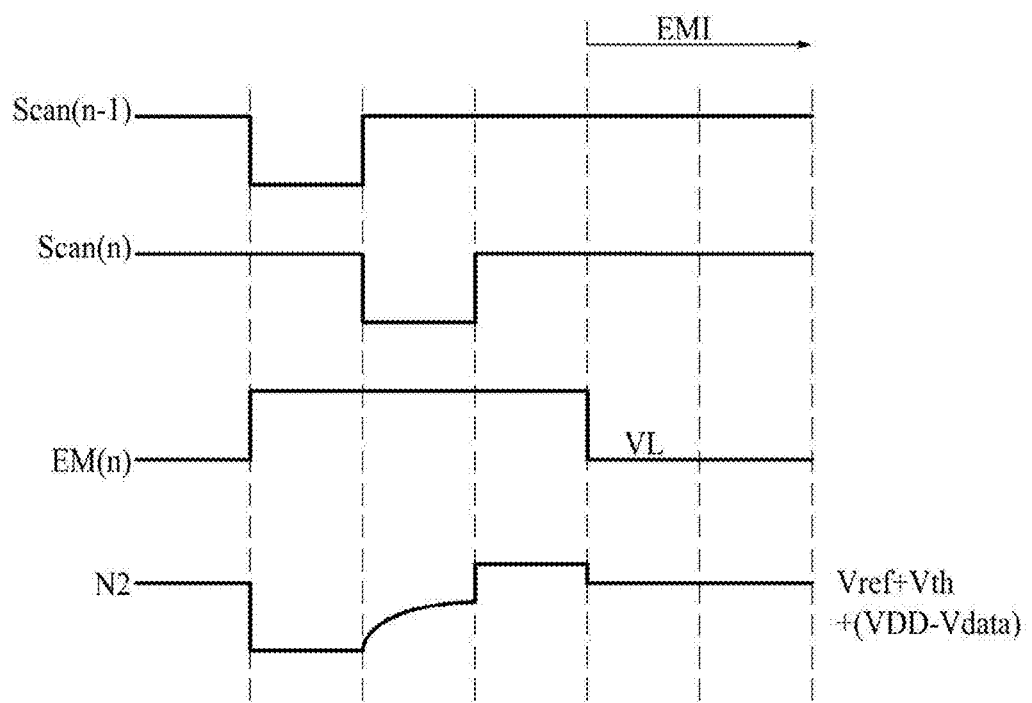
FIG. 24B is a waveform diagram for describing driving of the subpixel illustrated in FIG. 24A.

FIG. 24A is a diagram for describing driving of the subpixel according to the fourth embodiment of the present disclosure in the emission period. FIG. 24B is a waveform diagram for describing driving of the subpixel illustrated in FIG. 24A.

In the emission period EMI, the nth emission signal EM(n) may have a gate-on voltage.

The third transistor T3, the sixth transistor T6, and the fourth transistor T4 may be turned on by the gate-on voltage of the nth emission signal EM(n) applied thereto. Therefore, the high-level power voltage VDD may be applied to the second electrode of the capacitor Cst, and thus, due to coupling of the capacitor Cst, a voltage of the second node N2 may become "Vref+Vth+(Vdd−Vdata)". Also, the high-level power voltage VDD may be applied to the source of the driving transistor DT, and thus, the driving transistor DT may be turned on. Also, the fourth transistor T4 may be turned on, and thus, may allow a current to flow between the third node N3 and the fourth node N4. Accordingly, a driving current generated in the turned-on driving transistor DT may be applied to the anode of the light emitting device EL through the fourth transistor T4 to allow the light emitting device EL to emit light. The fourth transistor T5 may maintain a turn-off state in a period other than the emission period EMI, thereby preventing undesired emission of light.

A current of the nth subpixel SP according to the fourth embodiment of the present disclosure may be expressed as the following Equation:

$$I_{oled}=K(V_{gs}-V_{th})^2=K\{(V_{ref}+V_{th}+(V_{DD}-V_{data}))-V_{DD}-V_{th}\}^2=K(V_{ref}-V_{data})^2$$

where Ioled denotes a current flowing through the light emitting device EL, K denotes a constant, Vgs denotes a voltage between the gate and the source of the driving transistor DT, Vth denotes the threshold voltage of the driving transistor DT, VDD denotes the high-level power voltage applied through the high level power line VDDL, Vref denotes the reference voltage applied through the reference voltage line VrefL, and Vdata denotes a data voltage applied through the data line DL. For example, the high-level power voltage VDD may be 4.6V.

As seen in the Equation, Ioled may be determined based on a difference between the reference voltage and the data voltage. According to the Equation, in the nth subpixel SP according to the fourth embodiment of the present disclosure, it can be seen that the voltage drop of the high-level power voltage is compensated for, based on the reference voltage Vref which is applied to the source of the driving transistor DT in the sampling period SAM and the high-level power voltage VDD which is applied to the gate and the source of the driving transistor DT in the emission period EMI.

Therefore, a driving circuit for compensating for a sequential shift characteristic based on the voltage drop of the high-level power voltage may be implemented, and thus, an image quality issue such as the vertical luminance non-uniformity or crosstalk of a display device is solved.

Moreover, since the nth subpixel SP according to the fourth embodiment of the present disclosure includes the eighth transistor T8, the gate of the driving transistor DT may be initialized, thereby preventing an increase in luminance of a black screen of the display panel.

Moreover, the second and third transistors T2 and T3 of the plurality of transistors configuring the nth subpixel SP according to the fourth embodiment of the present disclosure may be disposed on one side of the non-display area and may be used in common by q number of subpixels disposed on an nth pixel line. Also, in a case where the gate driver 130 is disposed on each of the left and the right, the second and third transistors T2 and T3 may be disposed in each of a left non-display area and a right non-display area and may be used in common by q/2 number of subpixels. Therefore, the number of transistors configuring each subpixel is reduced, and thus, each subpixel is efficiently designed, thereby implementing a high-resolution display device. In this case, the other transistors (which are driving transistor DT, first transistor T1, fourth transistor T4, fifth transistor T5, sixth transistor T6, seventh transistor T7, the eight transistor T8, the ninth transistor T9) except for the second and third transistors T2 and T3 among the plurality of transistors, the light emitting device EL and the capacitor Cst configuring the nth subpixel SP may be necessary for an individual operation of each subpixel, and thus, cannot be used in common by the nth pixel line. Accordingly, since the second and third transistors T2 and T3 are disposed in the non-display area, the high-resolution display device may be implemented.

The electroluminescent display device according to embodiments of the present disclosure will be described as follows.

In an electroluminescent display device according to an embodiment of the present disclosure, the electroluminescent display device includes a display panel including a plurality of pixel lines each including a plurality of pixel circuits. Also, each of the plurality of pixel circuits included in an nth (where n is a natural number) pixel line of the plurality of pixel lines includes a driving transistor connected between a first node and a third node and including a gate connected to a second node, a first transistor allowing a current to flow between the second node and the third node in response to an n−1st scan signal, a second transistor applying a reference voltage to the first node in response to an nth scan signal, a third transistor applying a high-level power voltage to the first node in response to an nth emission signal, a fourth transistor allowing a current to flow between the third node and a fourth node in response to an n+1st emission signal, a fifth transistor applying an initialization voltage to the fourth node in response to the n−1st scan signal, a sixth transistor applying the high-level power voltage to a fifth node in response to the nth emission signal, a seventh transistor applying a data voltage to the fifth node in response to the n−1st scan signal, a capacitor connected between the second node and the fifth node, and a light emitting device including an node connected to the fourth node and a cathode connected to a line to which a low-level power voltage is applied. The display panel may include a display area and a non-display area. The display panel may include a display area and a non-display area. Accordingly, a subpixel supplied with the reference voltage may provide the light emitting device with a driving current unaffected by the high-level power voltage, thereby solving an image quality issue of the electroluminescent display device.

According to another feature of the present disclosure, the reference voltage may be a voltage which is higher than the low-level power voltage and is lower than the high-level power voltage, the initialization voltage may be a voltage which is equal to or lower than the low-level power voltage, and a period where the n−1st scan signal has a gate-on voltage and a period where the nth scan signal has the gate-on voltage may overlap each other.

According to another feature of the present disclosure, the n−1st scan signal and the nth scan signal may be activated to the gate-on voltage during two horizontal periods, and the nth emission signal and the n+1st emission signal may be deactivated to a gate-off voltage during three horizontal periods.

According to another feature of the present disclosure, one frame for driving each of the plurality of pixel circuits may include an initialization period where a gate-on voltage of the n−1st scan signal is input to an n−1st pixel line and the gate-on voltage of the n+1st emission signal is held by an n+1st pixel line, a sampling period where the gate-on voltage of the n−1st scan signal is held by the n−1st pixel line and the gate-on voltage of the nth scan signal is input to an nth pixel line, a holding period where the gate-on voltage of the nth scan signal is held by the nth pixel line, a programming period where the gate-on voltage of the nth emission signal is input to the nth pixel line, and an emission period where the light emitting device emits light. Also, in the initialization period, the first transistor, the fourth transistor, the fifth transistor, and the seventh transistor may be turned on, and in the sampling period, the first transistor, the second transistor, the fifth transistor, and the seventh transistor may be turned on. Also, in the holding period, the second transistor may be turned on, and in the programming period, the third transistor and the sixth transistor may be turned on. Also, in the emission period, the third transistor, the fourth transistor, and the sixth transistor may be turned on.

According to another feature of the present disclosure, the first transistor may be a double-gate type transistor.

In an electroluminescent display device according to an embodiment of the present disclosure, the electroluminescent display device includes a display panel including a plurality of pixel lines each including a plurality of pixel circuits. Also, each of the plurality of pixel circuits included in an nth pixel line of the plurality of pixel lines includes a driving transistor connected between a first node and a third node and including a gate connected to a second node, a first transistor allowing a current to flow between the second node and the third node in response to an nth scan signal, a second transistor applying a reference voltage to the first node in response to the nth scan signal, a third transistor applying a high-level power voltage to the first node in response to an nth emission signal, a fourth transistor allowing a current to flow between the third node and a fourth node in response to the nth emission signal, a fifth transistor applying an initialization voltage to the fourth node in response to the nth scan signal, a sixth transistor applying the high-level power voltage to a fifth node in response to the nth emission signal, a seventh transistor applying a data voltage to the fifth node in response to the nth scan signal, an eighth transistor supplying an initialization voltage to the second node in response to an n−1st scan signal, a capacitor connected between the second node and the fifth node, and a light emitting device including an node connected to the fourth node and a cathode connected to a line to which a low-level power voltage is applied. The display panel may include a display area and a non-display area. Accordingly, a subpixel supplied with the reference voltage may provide the light emitting device with a driving current unaffected by the high-level power voltage, thereby solving an image quality issue of the electroluminescent display device.

According to another feature of the present disclosure, one frame for driving each of the plurality of pixel circuits may include an initialization period where a gate-on voltage of the n−1st scan signal is input to an n−1st pixel line, a sampling period where the gate-on voltage of the nth scan signal is input to an nth pixel line, a holding period where a gate-off voltage of each of the n−1st scan signal and the nth scan signal is input to the nth pixel line, and an emission period where the gate-on voltage of the nth emission signal is input to the nth pixel line. Also, in the initialization period, the eighth transistor may be turned on, and in the sampling period, the first transistor, the second transistor, the fifth transistor, and the seventh transistor may be turned on. Also, in the holding period, the first to eighth transistors may be turned off, and in the emission period, the third transistor, the fourth transistor, and the sixth transistor may be turned on.

According to another feature of the present disclosure, in the initialization period, the sampling period, and the holding period, the nth emission signal may have the gate-off voltage.

According to another feature of the present disclosure, the n−1st scan signal and the nth scan signal may be activated to the gate-on voltage during one horizontal period, and the nth emission signal may be deactivated to the gate-off voltage during three horizontal periods.

According to another feature of the present disclosure, each of the first transistor and the eighth transistor may be a double-gate type transistor.

In an electroluminescent display device according to an embodiment of the present disclosure, the electroluminescent display device includes a display panel including a plurality of pixel lines each including a plurality of pixel circuits. Also, each of the plurality of pixel circuits included in an nth pixel line of the plurality of pixel lines includes a driving transistor connected between a first node and a third node and including a gate connected to a second node, a first transistor allowing a current to flow between the second node and the third node in response to an n+1st scan signal, a second transistor applying a reference voltage to the first node in response to an nth scan signal, a third transistor applying a high-level power voltage to the first node in response to an nth emission signal, a fifth transistor applying an initialization voltage to the fourth node in response to an n−1st scan signal, a sixth transistor applying the high-level power voltage to a fifth node in response to the nth emission signal, a ninth transistor applying the high-level power voltage to the fifth node in response to the n−1st scan signal, a seventh transistor applying a data voltage to the fifth node in response to the n+1st scan signal, a capacitor connected between the second node and the fifth node, and a light emitting device including an node connected to the fourth node and a cathode connected to a line to which a low-level power voltage is applied. The display panel may include a display area and a non-display area. Accordingly, a subpixel supplied with the reference voltage may provide the light emitting device with a driving current unaffected by the high-level power voltage, thereby solving an image quality issue of the electroluminescent display device.

According to another feature of the present disclosure, the reference voltage may be a voltage which is higher than the low-level power voltage and is lower than the high-level power voltage, the initialization voltage may be a voltage which is equal to or lower than the low-level power voltage, and a period where the n−1st scan signal has a gate-on voltage and a period where the nth scan signal has the gate-on voltage may overlap each other.

According to another feature of the present disclosure, the n−1st scan signal and the nth scan signal may be activated to the gate-on voltage during two horizontal periods, and the nth emission signal may be deactivated to a gate-off voltage during four horizontal periods.

According to another feature of the present disclosure, one frame for driving each of the plurality of pixel circuits may include an initialization period where a gate-on voltage of the n−1st scan signal is input to an n−1st pixel line, a first holding period where the gate-on voltage of the n−1st scan signal is held by the n−1st pixel line and the gate-on voltage of the nth scan signal is input to an nth pixel line, a sampling period where the gate-on voltage of the nth scan signal is held by the nth pixel line and the gate-on voltage of the n+1st scan signal is input to an n+1st pixel line, a second holding period where the gate-on voltage of the n+1st scan signal is held by the n+1st pixel line, and an emission period where the light emitting device emits light. Also, in the initialization period, the fifth transistor and the ninth transistor may be turned on, and in the first holding period, the second transistor, the fifth transistor, and the ninth transistor may be turned on. Also, in the sampling period, the first transistor, the second transistor, and the seventh transistor may be turned on, and in the second holding period, the first transistor and the seventh may be turned on. Also, in the emission period, the third transistor and the sixth transistor may be turned on.

According to another feature of the present disclosure, the first transistor may be a double-gate type transistor.

In an electroluminescent display device according to an embodiment of the present disclosure, the electroluminescent display device includes a display panel including a plurality of pixel lines each including a plurality of pixel circuits. Also, each of the plurality of pixel circuits included in an nth pixel line of the plurality of pixel lines includes a driving transistor connected between a first node and a third node and including a gate connected to a second node, a first transistor allowing a current to flow between the second node and the third node in response to an nth scan signal, a second transistor applying a reference voltage to the first node in response to the nth scan signal, a third transistor applying a high-level power voltage to the first node in response to an nth emission signal, a fifth transistor applying an initialization voltage to a fourth node in response to the nth scan signal, a sixth transistor applying the high-level power voltage to a fifth node in response to the nth emission signal, a ninth transistor applying the high-level power voltage to a fifth node in response to an n−1st scan signal, a seventh transistor applying a data voltage to the fifth node in response to the nth scan signal, an eighth transistor supplying an initialization voltage to the second node in response to the n−1st scan signal, a fourth transistor allowing a current to flow between the third node and a fourth node in response to the nth emission signal, a capacitor connected between the second node and the fifth node, and a light emitting device including an node connected to the fourth node and a cathode connected to a line to which a low-level power voltage is applied. The display panel may include a display area and a non-display area. Accordingly, a subpixel supplied with the reference voltage may provide the light emitting device with a driving current unaffected by the high-level power voltage, thereby solving an image quality issue of the electroluminescent display device.

According to another feature of the present disclosure, one frame for driving each of the plurality of pixel circuits may include an initialization period where a gate-on voltage of the n−1st scan signal is input to an n−1st pixel line, a sampling period where the gate-on voltage of the nth scan signal is input to an nth pixel line, a holding period where a gate-off voltage of each of the n−1st scan signal and the nth scan signal is input to the nth pixel line, and an emission period where the gate-on voltage of the nth emission signal is input to the nth pixel line. Also, in the initialization period, the ninth transistor and the eighth transistor may be turned on, and in the sampling period, the first transistor, the second transistor, the fifth transistor, and the seventh transistor may be turned on. Also, in the holding period, the first to ninth transistors may be turned off, and in the emission period, the third transistor, the sixth transistor, and the fourth transistor may be turned on.

According to another feature of the present disclosure, in the initialization period, the sampling period, and the holding period, the nth emission signal may have the gate-off voltage.

According to another feature of the present disclosure, the n−1st scan signal and the nth scan signal may be activated to the gate-on voltage during one horizontal period, and the nth emission signal may be deactivated to the gate-off voltage during three horizontal periods.

According to another feature of the present disclosure, each of the first transistor and the eighth transistor may be a double-gate type transistor.

According to another feature of the present disclosure, the second transistor and the third transistor may be in the non-display area.

According to another feature of the present disclosure, the second transistor and the third transistor may be used in common by each the plurality of pixel lines.

According to another feature of the present disclosure, the initialization voltage may be equal to or lower than the low-level power voltage, and the reference voltage may be higher than the low-level power voltage and lower than the high-level power voltage.

As described above, according to the embodiments of the present disclosure, a pixel circuit for compensating for a sequential shift characteristic based on the voltage drop of a source voltage may be implemented, thereby solving an image quality issue such as the vertical luminance non-uniformity or cross-talk of a display panel.

Moreover, according to the embodiments of the present disclosure, some of a plurality of transistors for driving each pixel circuit may be disposed in a non-display area and may be used in common by pixel circuits connected to the same pixel line, and thus, an efficiency of designing pixel circuits is enhanced, thereby realizing a high-resolution display device.

It will be apparent to those skilled in the art that various modifications and variations can be made in the electroluminescent display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. An electroluminescent display device comprising:
a display panel including a plurality of pixel lines each including a plurality of pixel circuits,
wherein each of the plurality of pixel circuits included in an nth (where n is a natural number) pixel line of the plurality of pixel lines comprises:
a driving transistor connected between a first node and a third node, the driving transistor including a gate connected to a second node;
a first transistor allowing a current to flow between the second node and the third node in response to an n−1st scan signal;
a second transistor applying a reference voltage to the first node in response to an nth scan signal;
a third transistor applying a high-level power voltage to the first node in response to an nth emission signal;
a fourth transistor allowing a current to flow between the third node and a fourth node in response to the n+1st emission signal;
a fifth transistor applying an initialization voltage to the fourth node in response to the n−1st scan signal;
a sixth transistor applying the high-level power voltage to a fifth node in response to the nth emission signal;
a seventh transistor applying a data voltage to the fifth node in response to the n−1st scan signal;
a capacitor connected between the second node and the fifth node; and
a light emitting device including an node connected to the fourth node and a cathode connected to a line to which a low-level power voltage is applied.

2. The electroluminescent display device of claim 1, wherein
one frame for driving each of the plurality of pixel circuits comprises an initialization period where a gate-on voltage of the n−1st scan signal is input to an n−1st pixel line and the gate-on voltage of the n+1$^{st}$ emission signal is held by an n+1$^{st}$ pixel line, a sampling period where the gate-on voltage of the n−1st scan signal is held by the n−1st pixel line and the gate-on voltage of the nth scan signal is input to an nth pixel line, a holding period where the gate-on voltage of the nth scan signal is held by the nth pixel line, a programming period where the gate-on voltage of the nth emission signal is input to the nth pixel line, and an emission period where the light emitting device emits light, in the initialization period, the first transistor, the fourth transistor, the fifth transistor, and the seventh transistor are turned on, in the sampling period, the first transistor, the second transistor, the fifth transistor, and the seventh transistor are turned on, in the holding period, the second transistors is turned on, in the programming period, the third transistor and the sixth transistor are turned on, and in the emission period, the third transistor, the fourth transistor, and the sixth transistor are turned on.

3. The electroluminescent display device of claim 2, wherein in the initialization period, the sampling period, and the holding period, the nth emission signal has the gate-off voltage.

4. The electroluminescent display device of claim 3, wherein the n−1st scan signal and the nth scan signal are activated to the gate-on voltage during two horizontal period, and the nth emission signal is deactivated to the gate-off voltage during three horizontal periods.

5. The electroluminescent display device of claim 1, wherein the first transistor is a double-gate type transistor.

6. The electroluminescent display device of claim 1, wherein
the reference voltage is a voltage which is higher than the low-level power voltage and is lower than the high-level power voltage,
the initialization voltage is a voltage which is equal to or lower than the low-level power voltage, and
a period where the n−1$^{st}$ scan signal has a gate-on voltage and a period where the nth scan signal has the gate-on voltage overlap each other.

7. The electroluminescent display device of claim 1, wherein the second transistor (T2) and the third transistor (T3) are in the non-display area.

8. The electroluminescent display device of claim 7, wherein the second transistor (T2) and the third transistor (T3) are used in common by each the plurality of pixel lines.

9. An electroluminescent display device comprising:
a display panel including a plurality of pixel lines each including a plurality of pixel circuits,
wherein each of the plurality of pixel circuits included in an nth (where n is a natural number) pixel line of the plurality of pixel lines comprises:
a driving transistor connected between a first node and a third node, the driving transistor including a gate connected to a second node;
a first transistor allowing a current to flow between the second node and the third node in response to an n+1$^{st}$ scan signal;
a second transistor applying a reference voltage to the first node in response to an nth scan signal;
a third transistor applying a high-level power voltage to the first node in response to an nth emission signal;
a fifth transistor applying an initialization voltage to a fourth node in response to an n−1$^{st}$ scan signal;
a sixth transistor applying the high-level power voltage to a fifth node in response to the nth emission signal;
a ninth transistor applying the high-level power voltage to the fifth node in response to the n−1$^{st}$ scan signal;
a seventh transistor applying a data voltage to the fifth node in response to the n+1$^{st}$ scan signal;
a capacitor connected between the second node and the fifth node; and
a light emitting device including an node connected to the fourth node and a cathode connected to a line to which a low-level power voltage is applied.

10. The electroluminescent display device of claim 9, wherein the third node and the fourth node are same node.

11. The electroluminescent display device of claim 9, wherein
the reference voltage is a voltage which is higher than the low-level power voltage and is lower than the high-level power voltage,
the initialization voltage is a voltage which is equal to or lower than the low-level power voltage, and
a period where the n−1$^{st}$ scan signal has a gate-on voltage and a period where the nth scan signal has the gate-on voltage overlap each other.

12. The electroluminescent display device of claim 11, wherein the n−1$^{st}$ scan signal and the nth scan signal are activated to the gate-on voltage during two horizontal periods, and the nth emission signal is deactivated to a gate-off voltage during four horizontal periods.

13. The electroluminescent display device of claim 9, wherein
one frame for driving each of the plurality of pixel circuits comprises an initialization period where a gate-on voltage of the n−1$^{st}$ scan signal is input to an n−1st pixel line, a first holding period where the gate-on voltage of the n−1$^{st}$ scan signal is held by the n−1$^{st}$ pixel line and the gate-on voltage of the nth scan signal is input to an nth pixel line, a sampling period where the gate-on voltage of the nth scan signal is held by the nth pixel line and the gate-on voltage of the n+1$^{st}$ scan signal is input to an n+1$^{st}$ pixel line, a second holding period where the gate-on voltage of the n+1$^{st}$ scan signal is held by the n+1$^{st}$ pixel line, and an emission period where the light emitting device emits light,
in the initialization period, the fifth transistor and the ninth transistor are turned on,
in the first holding period, the second transistor, the fifth transistor, and the ninth transistor are turned on,
in the sampling period, the first transistor, the second transistor, and the seventh transistor are turned on,
in the second holding period, the first transistor and the seventh are turned on, and
in the emission period, the third transistor and the sixth transistor are turned on.

14. The electroluminescent display device of claim 13, wherein in the initialization period, the first holding period, the sampling period, and the second holding period, the nth emission signal has the gate-off voltage.

15. The electroluminescent display device of claim 9, wherein the first transistor is a double-gate type transistor.

16. The electroluminescent display device of claim 9, wherein the second transistor (T2) and the third transistor (T3) are in the non-display area.

17. The electroluminescent display device of claim 16, wherein the second transistor (T2) and the third transistor (T3) are used in common by each the plurality of pixel lines.

18. The electroluminescent display device of claim 16, wherein the driving transistor, the first transistor, the fifth transistor, the sixth transistor, the seventh transistor, the ninth transistor, the light emitting device, and the capacitor are in the display area.

* * * * *

UNITED STATES PATENT AND TRADEMARK OFFICE
CERTIFICATE OF CORRECTION

PATENT NO.        : 10,540,928 B2
APPLICATION NO.   : 16/563803
DATED             : January 21, 2020
INVENTOR(S)       : Donghyun Kim et al.

Page 1 of 1

It is certified that error appears in the above-identified patent and that said Letters Patent is hereby corrected as shown below:

On the Title Page

Column 1, Item (30), Line 3, "10-2017-0163681" should be changed to --10-2017-0163682--.

Signed and Sealed this
Seventeenth Day of March, 2020

Andrei Iancu
*Director of the United States Patent and Trademark Office*